United States Patent
Okatake et al.

(10) Patent No.: US 9,513,348 B2
(45) Date of Patent: Dec. 6, 2016

(54) HALL ELECTROMOTIVE FORCE SIGNAL DETECTION CIRCUIT AND CURRENT SENSOR THEREOF

(71) Applicant: Asahi Kasei Microdevices Corporation, Tokyo (JP)

(72) Inventors: Shigeki Okatake, Tokyo (JP); Takenobu Nakamura, Tokyo (JP); Makoto Kataoka, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 334 days.

(21) Appl. No.: 13/753,009

(22) Filed: Jan. 29, 2013

(65) Prior Publication Data

US 2013/0193962 A1 Aug. 1, 2013

(30) Foreign Application Priority Data

Jan. 30, 2012 (JP) .................................. 2012-017015
Nov. 12, 2012 (JP) ................................. 2012-248277

(51) Int. Cl.
*G01R 33/07* (2006.01)
*G01R 15/20* (2006.01)
*G01R 31/42* (2006.01)

(52) U.S. Cl.
CPC ........... *G01R 33/075* (2013.01); *G01R 15/202* (2013.01); *G01R 31/42* (2013.01)

(58) Field of Classification Search
CPC .. G01R 33/07; G01R 33/075; G01R 15/202; G01R 33/06; G01R 33/0005; G01R 33/02; G01R 33/0206; G01R 33/095; G01R 33/072; G01R 33/0035; G01R 33/0029; G01R 33/12; G01R 33/0023; G01R 33/09; G01R 33/0094; G01R 33/0017; G01R 33/077; G01R 15/207; G01R 19/0092; G01R 35/005; G01D 18/008; G01D 3/021; G01D 3/028; G01D 3/036; G01D 3/02; G01D 5/24409; G01D 5/24428; G01D 5/24438; G01D 5/24476; G01D 5/142; G01D 5/147; G01D 5/2448; G01D 5/14; G01D 5/145; H01L 43/06; H01L 43/04; H01L 43/065; H03M 3/34

USPC ................ 324/207.2–207.25, 251, 173, 174, 324/207.12, 117 H; 327/511, 124, 307; 73/514.1; 338/32 H, 32 R, 32 S; 330/6, 330/9, 6.9, 639

See application file for complete search history.

(56) References Cited

U.S. PATENT DOCUMENTS 5,406,202 A * 4/1995 Mehrgardt et al. ........... 324/251
5,621,319 A * 4/1997 Bilotti et al. .................. 324/251

(Continued)

FOREIGN PATENT DOCUMENTS

JP 9-196699 A 7/1997
JP 2008-309626 A 12/2008

OTHER PUBLICATIONS

Popovic, Hall Effect Devices, ISBN 0-7503-0096-5, Inst of Physics Pub Inc. pp. 186-191, (May 1991).

(Continued)

*Primary Examiner* — Arleen M Vazquez
*Assistant Examiner* — Lee Rodak
(74) *Attorney, Agent, or Firm* — Morgan, Lewis & Bockius LLP

(57) ABSTRACT

A Hall electromotive force signal detection circuit combines offset cancellation means by a spinning current method of a Hall element with a continuous-time signal processing circuit. A Hall element includes first to fourth terminals, and generates a Hall electromotive force signal voltage Vhall1. Another Hall element generates another Hall electromotive force signal voltage Vhall2. A first switching circuit selects a terminal position for applying a drive current from the four terminals of the Hall element. A second switching circuit selects a terminal position for applying a drive current from the four terminals of the another Hall element, which is different from the terminal position selected by the first switching circuit. A chopper clock generation circuit supplies a chopper clock signal φ1, φ2 having two different phases to the switching circuit, and also supplies the chopper clock signal φ1, φ2 to the first and second switching circuits.

7 Claims, 17 Drawing Sheets

(56) References Cited

U.S. PATENT DOCUMENTS

| | | | |
|---|---|---|---|
| 5,747,995 A * | 5/1998 | Spies | 324/207.2 |
| 6,768,301 B1 * | 7/2004 | Hohe et al. | 324/251 |
| 6,927,572 B2 | 8/2005 | Motz | |
| 2003/0102909 A1 * | 6/2003 | Motz | 330/9 |
| 2003/0155912 A1 * | 8/2003 | Motz | 324/225 |
| 2005/0258840 A1 * | 11/2005 | Ausserlechner | 324/706 |
| 2007/0029999 A1 * | 2/2007 | Middelhoek et al. | 324/251 |
| 2008/0030191 A1 * | 2/2008 | Nishikawa | G01R 33/07 324/252 |
| 2009/0009164 A1 | 1/2009 | Utsuno | |
| 2009/0201017 A1 | 8/2009 | Peev et al. | |
| 2010/0156394 A1 * | 6/2010 | Ausserlechner et al. | 324/144 |

OTHER PUBLICATIONS

Bilotti et al., Monolithic Magnetic Hall Sensor Using Dynamic Quadrature Offset Cancellation, IEEE Journal of Solid-State Circuits, vol. 32, pp. 829-836, Jun. 1997.

Japanese Office Action dated Apr. 8, 2014 for corresponding JP Application No. 2012-248277.

* cited by examiner

WHEN CHOPPER CLOCK PHASE IS φ1 AND HALL ELEMENT DRIVE DIRECTION IS 0 DEGREE

WHEN CHOPPER CLOCK PHASE IS φ2 AND HALL ELEMENT DRIVE DIRECTION IS 90 DEGREES

DIRECTION OF MAGNETIC FIELD DETECTED BY HALL ELEMENT IS PERPENDICULAR TO PAPER SURFACE

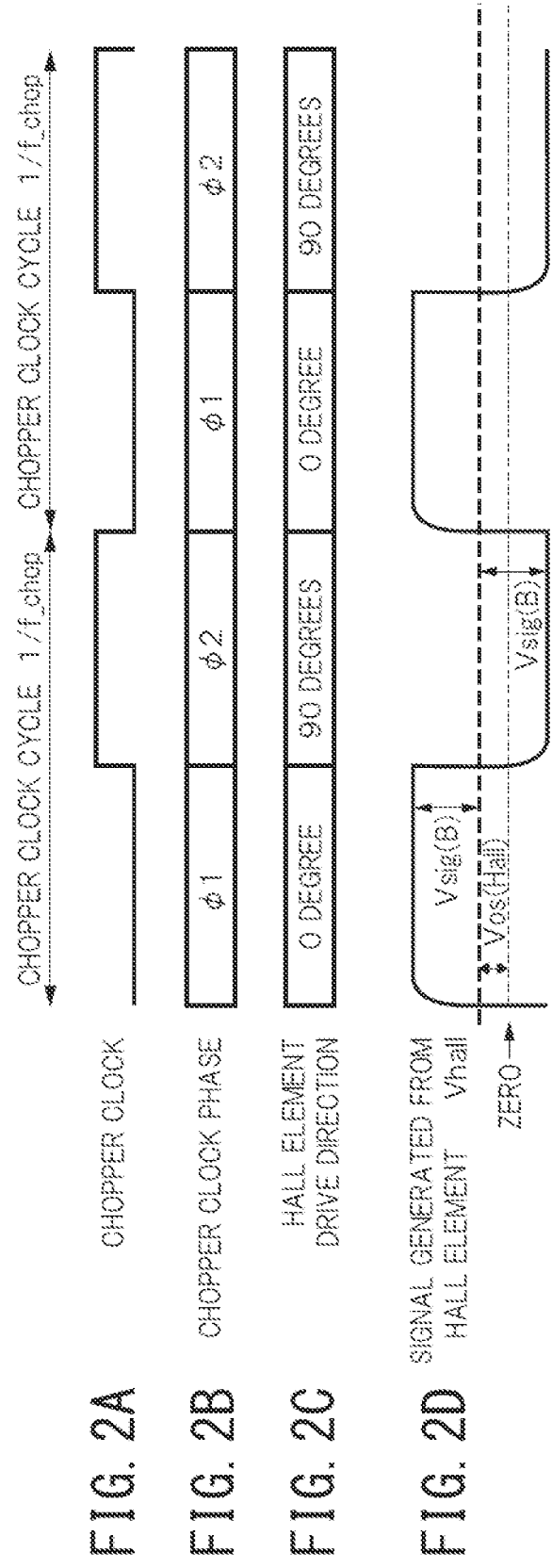

FIG. 5A
FIG. 5B
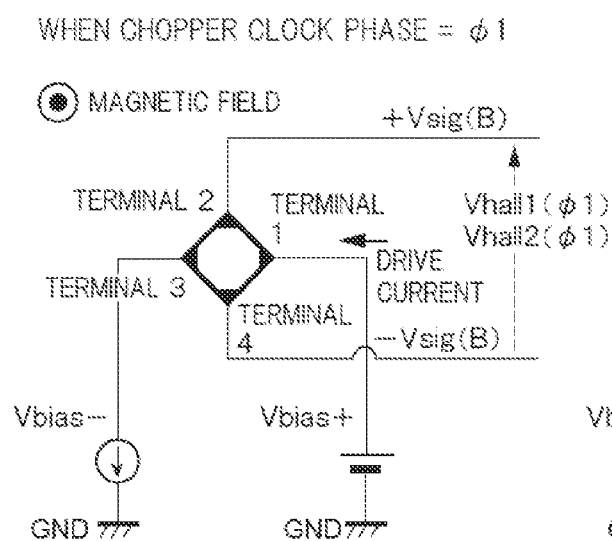
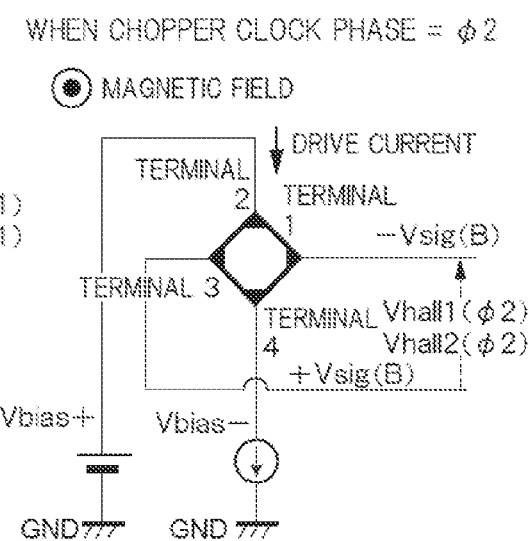

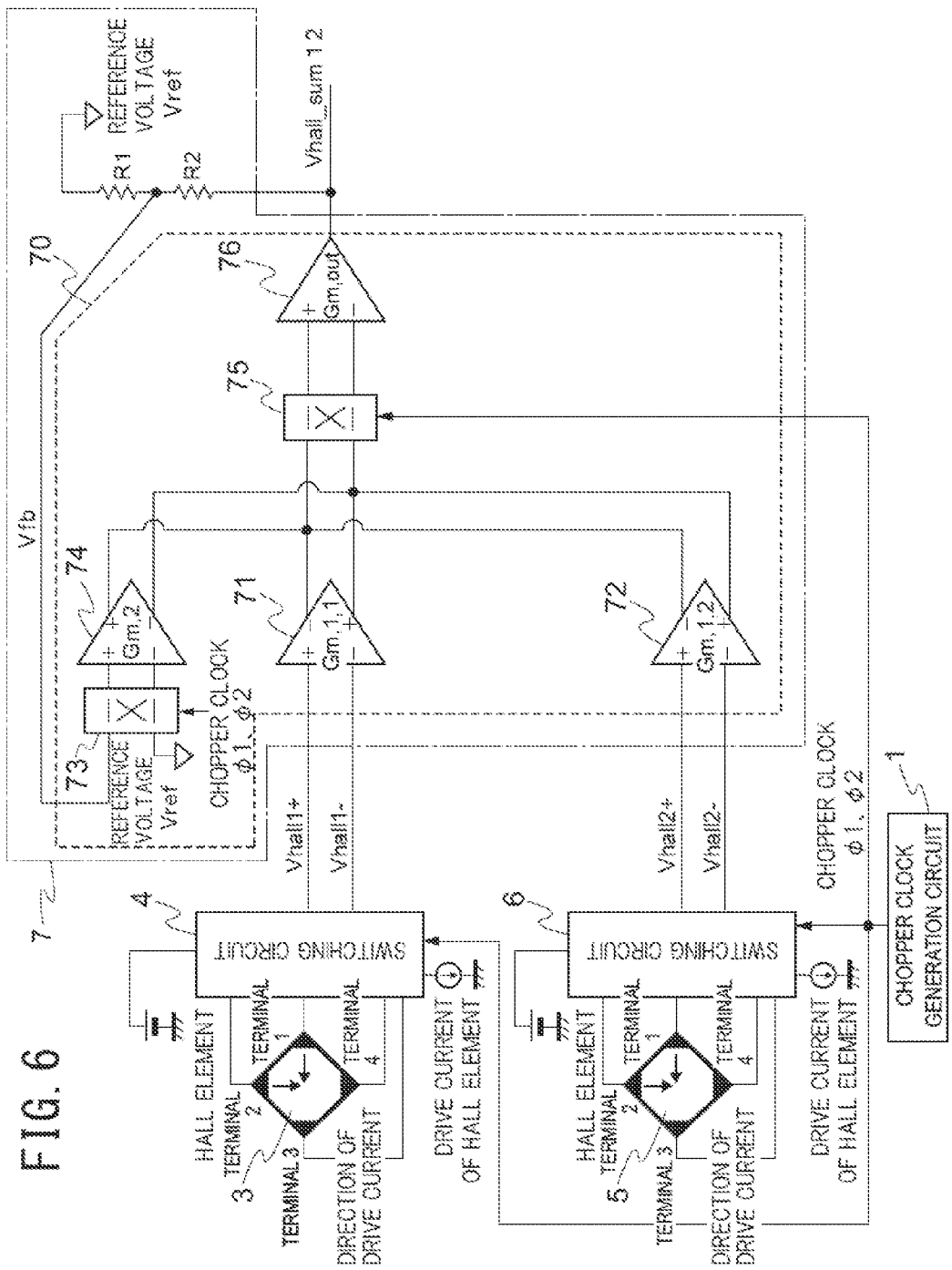

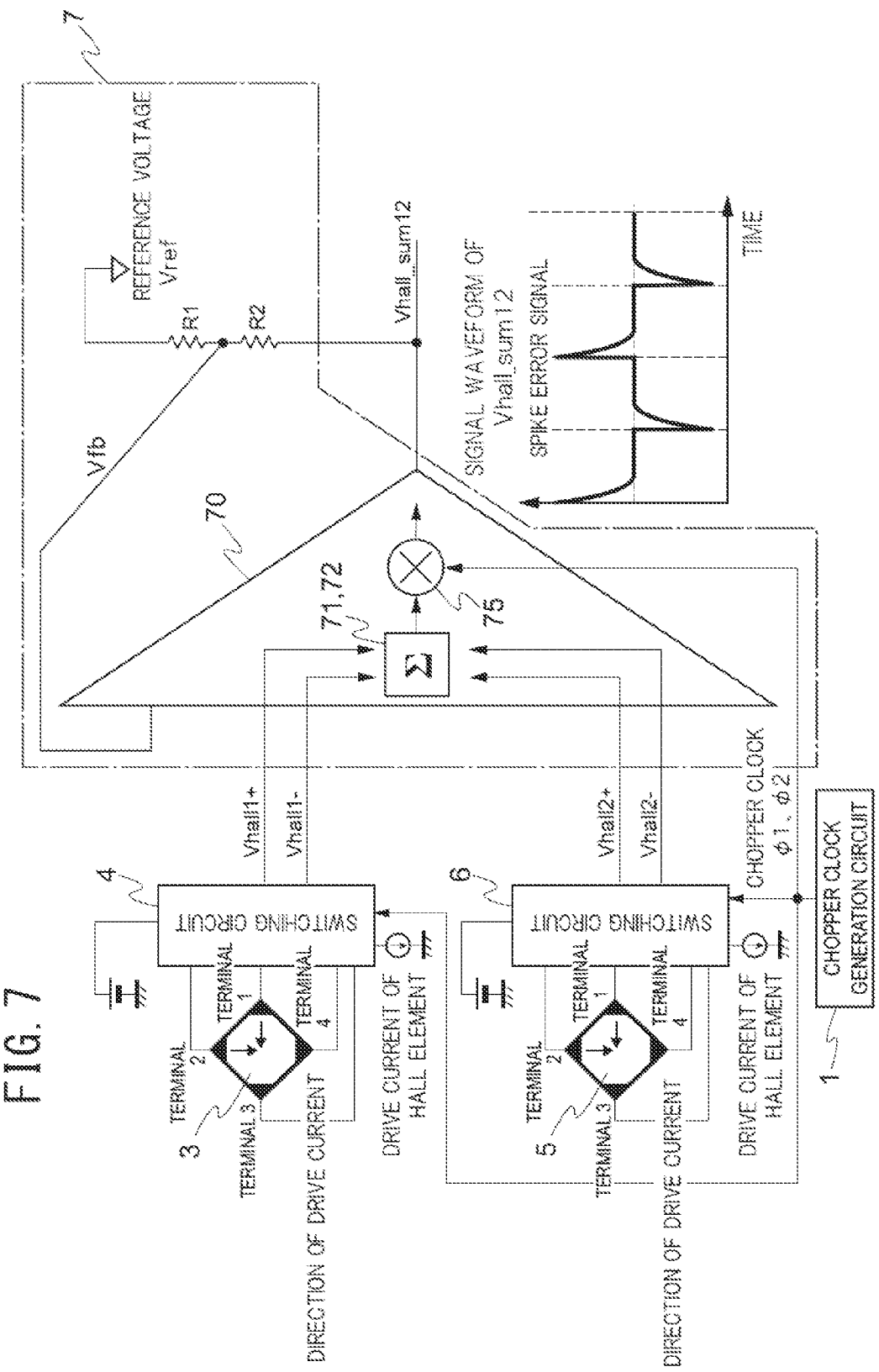

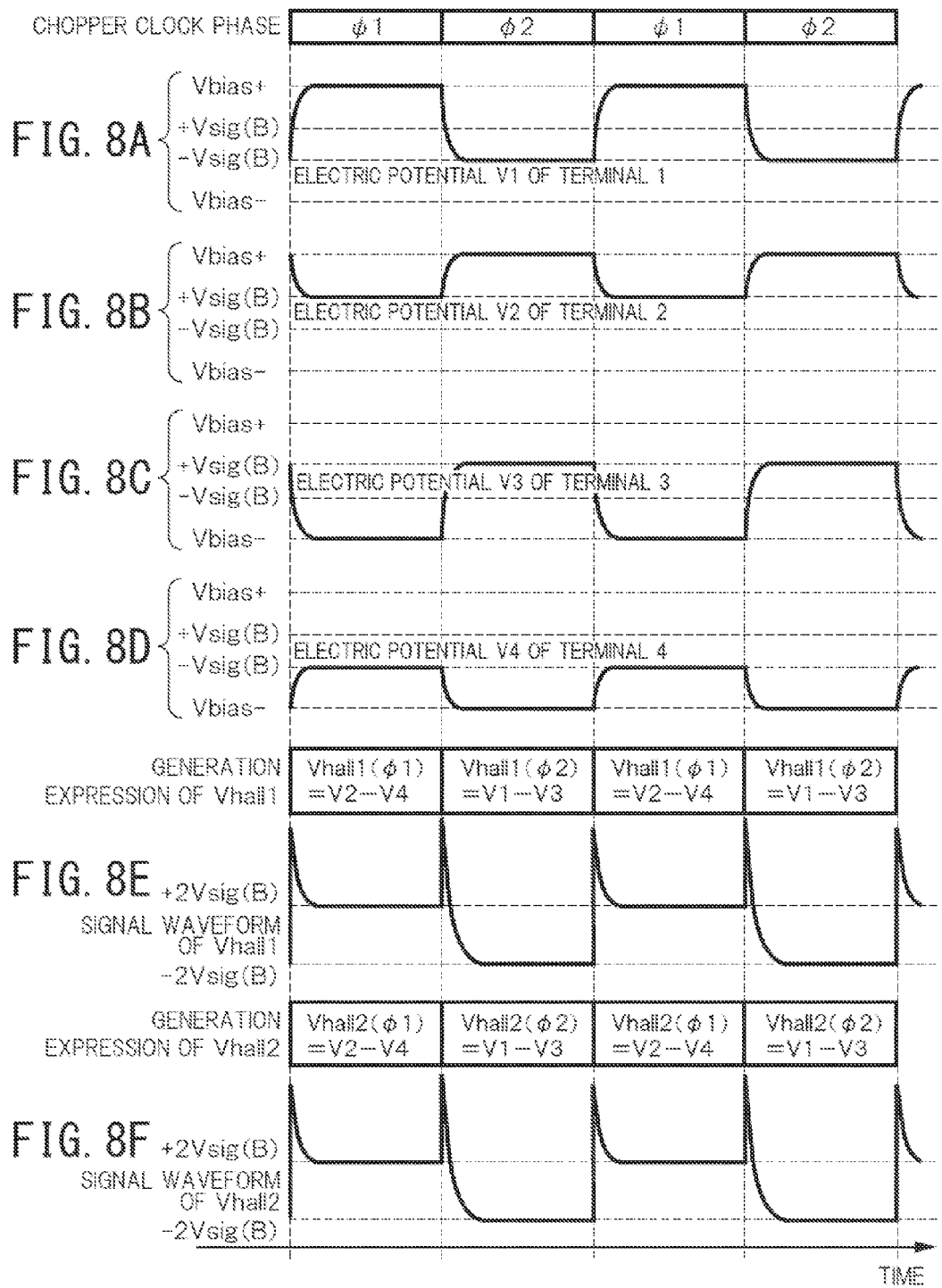

| CHOPPER CLOCK PHASE | φ1 | φ2 | φ1 | φ2 |

FIG. 9A
SIGNAL WAVEFORM OF DEMODULATED Vhall1
+2Vsig(B)
0
−2Vsig(B)

FIG. 9B
SIGNAL WAVEFORM OF DEMODULATED Vhall2
+2Vsig(B)
0
−2Vsig(B)

FIG. 9C
SIGNAL WAVEFORM OF OUTPUT SIGNAL Vhall_sum 12
SIGNAL WAVEFORM OF DEMODULATED Vhall1 + DEMODULATED Vhall2
+4Vsig(B)
+2Vsig(B)
0
−2Vsig(B)
−4Vsig(B)

SUCH SPIKE ERROR SIGNAL HINDERS ACCURACY ENHANCEMENT

TIME

WHEN CHOPPER CLOCK PHASE = φ1

WHEN CHOPPER CLOCK PHASE = φ2

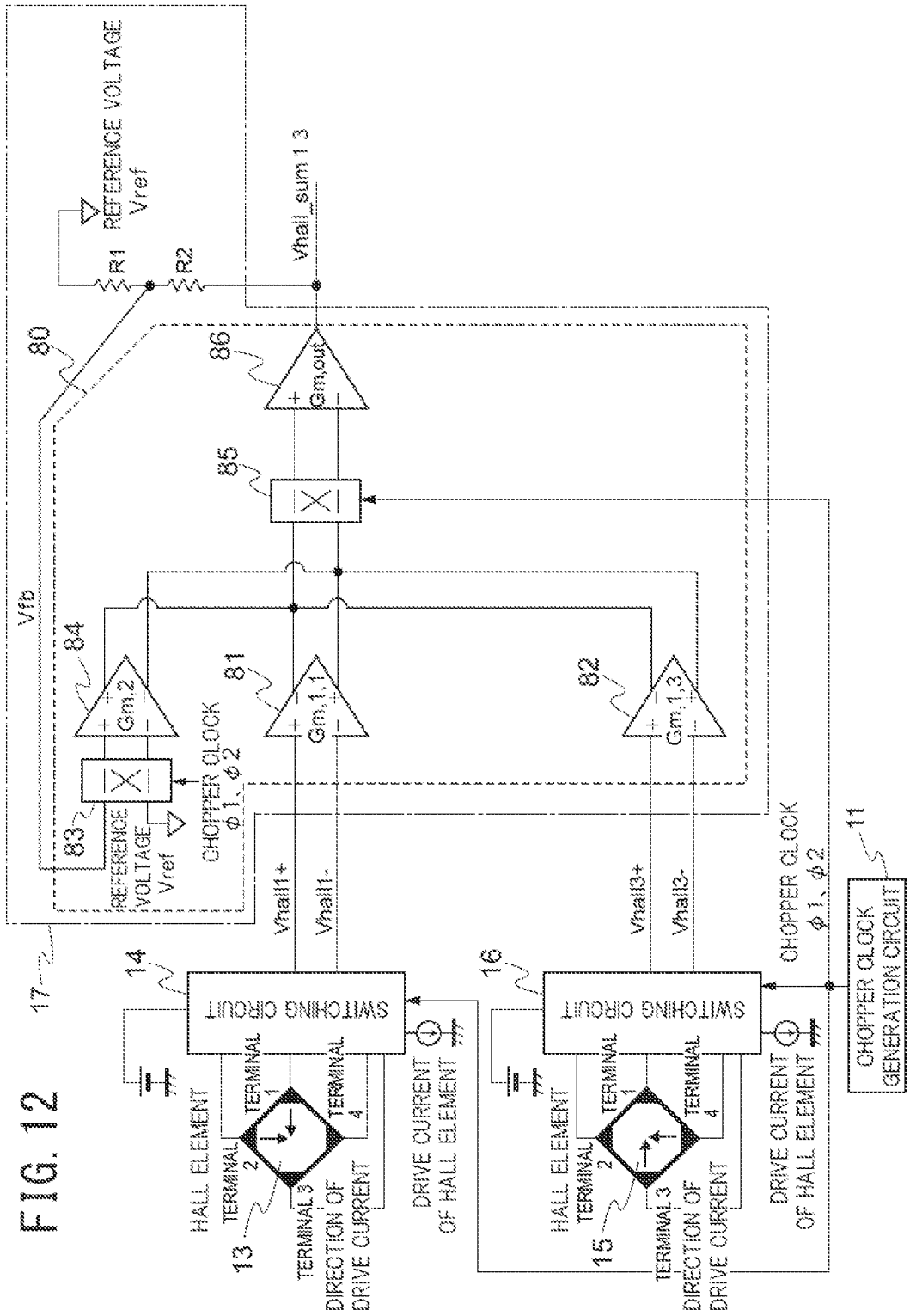

HALL ELECTROMOTIVE FORCE SIGNAL DETECTION CIRCUIT AND CURRENT SENSOR THEREOF

TECHNICAL FIELD

The present invention relates to Hall electromotive force signal detection circuits and current sensors thereof.

BACKGROUND ART

A magnetic sensor using a Hall element is not only used in a proximity sensor, a linear position sensor, a rotation angle sensor, and the like as a sensor for detecting position information of a magnet, but also widely used in a current sensor for detecting a magnetic field induced by a current flowing through a current conductor to thereby contactlessly measure the current flowing through the current conductor.

Particularly in a current sensor used to detect an inverter current of a motor, a current of an inverter switched at a high frequency needs to be detected with high accuracy, for the purpose of achieving efficient motor control.

The Hall element has a magneto-electric conversion function of generating a Hall electromotive force signal corresponding to an intensity of an input magnetic field, and so is widely used as a magnetic sensor. However, the Hall element has an offset voltage (unbalanced voltage) that is a finite nonzero voltage output even in a state where the magnetic field is zero, i.e. in a magnetic field-free state.

Accordingly, for the magnetic sensor using the Hall element, a Hall element driving method commonly known as a spinning current method or a connection commutation method is available with the aim of canceling out the offset voltage of the Hall element. In this method, an operation of periodically switching, according to a clock called a chopper clock, between a position of a terminal pair for flowing the drive current through the Hall element and a position of a terminal pair for detecting the Hall electromotive force signal is performed (for example, see Non-Patent Document 1 and Patent Document 2).

This spinning current method aimed at cancelling out the offset voltage can be implemented using a switching circuit in a CMOS semiconductor circuit. Hence, a Hall electromotive force signal detection circuit for realizing a high-accuracy magnetic sensor typically includes a switching circuit for implementing the spinning current method.

In a case where the magnetic sensor using the Hall element is applied to the measurement of the inverter current, the magnetic sensor is required to have properties such as a broadband property regarding signal bandwidth, a fast response property regarding signal processing delay time, and a low noise property regarding signal quality. In such a case, as a circuit system for processing the Hall electromotive force signal generated in the Hall element, a continuous-time signal processing circuit that performs signal processing in continuous time is advantageous over a discrete-time signal processing circuit that performs discrete-time processing (sampling). The continuous-time signal processing circuit is free from a phenomenon of folding noise caused by discrete-time processing (sampling), and therefore is a circuit structure especially suitable for use in an environment where significant high-frequency noise is caused by switching the inverter.

The spinning current method of the Hall element will be described below, with reference to FIG. 1A and FIG. 1B.

FIG. 1A and FIG. 1B are diagrams illustrating Hall electromotive force detection when the direction of the drive current for biasing the Hall element is switched between 0 degree and 90 degrees each time the phase of the chopper clock is switched between two values of $\phi 1$ and $\phi 2$ respectively. The Hall element in the drawing is modeled as a four-terminal element composed of four resistors (R1, R2, R3, and R4), and is driven by a constant current.

It should be noted that, in the model of the Hall element illustrated in FIG. 1A and FIG. 1B, the four resistors (R1, R2, R3, and R4) do not have fixed resistances. In a case where Hall elements are formed as N-wells in a semiconductor substrate, an impurity concentration distribution is developed in each Hall element typically due to a process gradient during semiconductor manufacture. Accordingly, an electric potential distribution in the Hall element (N-well) varies and also a depletion layer developed in the Hall element (N-well) varies depending on from which of the four terminals (terminals 1, 2, 3, and 4) the drive current is applied. Therefore, the resistances of the four resistors R1, R2, R3, and R4 in the model of the Hall element vary depending on from which of the four terminals (terminals 1, 2, 3, and 4) of the Hall element the drive current is applied.

In FIG. 1A and FIG. 1B, voltage signals Vhall($\phi 1$) and Vhall($\phi 2$) measured respectively when the phase of the chopper clock is $\phi 1$ (the drive direction of the Hall element is 0 degree) and when the phase of the chopper clock is $\phi 2$ (the drive direction of the Hall element is 90 degrees) are each represented as a sum of a Hall electromotive force signal Vsig(B) corresponding to a magnetic field B to be detected by the magnetic sensor using the Hall element and an offset voltage Vos(Hall) of the Hall element, as shown by Expression 1.

Here, the Hall electromotive force signal Vsig(B) corresponding to the magnetic field to be detected can be inverted in polarity by periodically switching the direction of the bias current of the Hall element between 0 degree and 90 degrees according to the phase of the chopper clock, so that Vsig(B) can be frequency-modulated to a frequency f chop of the chopper clock. On the other hand, the DC offset voltage Vos(Hall) of the Hall element remains in the same polarity even when the drive direction of the Hall element is switched between 0 degree and 90 degrees, and thus Vos (Hall) is not frequency-modulated by the chopper clock.

Expression 1:

Signal generated in Hall element [Math. 1]

$$\begin{cases} Vhall(\phi 1) = +Vsig(B) + Vos(\text{Hall}) & (\text{when chopper clock} = \phi 1) \\ Vhall(\phi 2) = +Vsig(B) + Vos(\text{Hall}) & (\text{when chopper clock} = \phi 2) \end{cases}$$

As a result, in the case of performing the operation of switching the direction of the drive current of the Hall element between 0 degree and 90 degrees according to the phase of the chopper clock, the signal Vhall generated in the Hall element has a waveform as illustrated in FIG. 2A to FIG. 2D. Besides, the signal generated in the Hall element has a spectrum as illustrated in FIG. 3, from which it can be understood that the Hall electromotive force signal Vsig(B) corresponding to the magnetic field to be detected and the offset voltage Vos(Hall) of the Hall element are separated in the frequency domain. This is the principle of offset cancellation of the Hall element by the spinning current method.

Moreover, for example, Patent Document 1 discloses that the direction of the drive current is switched clockwise in one of two Hall elements and switched counterclockwise in the other Hall element, with regard to the order and sequence in the spinning current method.

Patent Document 3 relates to a chopped Hall sensor that alternately switches flow of a Hall element excitation current from one direction to another direction, and discloses especially a Hall sensor where a chopped sample-and-hold Hall voltage circuit is clocked synchronously with the switched Hall sensor.

Non-Patent Document 2 discloses a circuit system that performs discrete-time processing (sampling) such as sample and hold, as a circuit structure for realizing the spinning current method of the Hall element.

PRIOR ART DOCUMENTS

Patent Documents

Patent Document 1: Specification of U.S. Pat. No. 6,927,572 B2
Patent Document 2: JP 2008-309626 A
Patent Document 3: JP 9-196699 A Non-Patent Document Non-Patent Document 1: R. S. Popovic, Hall Effect Devices (ISBN-10: 0750300965), Inst of Physics Pub Inc. (1991/05)
Non-Patent Document 2: IEEE Journal of Solid-State Circuits, Vol. 32, No. 6, 1997, pp. 829-836, Bilotti, et al. "Monolithic Magnetic Hall Sensor Using Dynamic Quadrature Offset Cancellation"

SUMMARY OF THE INVENTION

Problem to be Solved

Thus, a circuit system that performs discrete-time processing (sampling) such as sample and hold is available as a circuit structure for realizing the spinning current method of the Hall element. However, a circuit system that performs processing by a continuous-time signal is desired for use as a current sensor for detecting an inverter current, as mentioned above.

In the continuous-time signal processing system, the extent to which a spike error signal occurs upon switching varies depending on the order and sequence of selecting/switching the terminal for applying the drive current of the Hall element in the spinning current method.

In the method disclosed in Patent Document 1 described above, the operation of selecting the position of the terminal pair for applying the drive current of the Hall element and the position of the terminal pair for detecting the Hall electromotive force signal is performed in such a manner that these terminal pair positions are selected sequentially in the clockwise direction in one Hall element (Hall element 1) and selected sequentially in the counterclockwise direction in the other Hall element (Hall element 2). For the Hall element having four terminals, such an operation needs a time equivalent to four periods of the chopper clock.

The present invention has been made in view of the above-mentioned circumstances, and has an object of providing a Hall electromotive force signal detection circuit that can be suitably applied to a continuous-time signal processing circuit, and a current sensor thereof.

Solution to the Problem

The present invention has been made to achieve the object stated above. In one embodiment, a Hall electromotive force signal detection circuit configured to select a terminal position for applying a drive current to a Hall element including a plurality of terminals and detect a Hall electromotive force signal voltage, the Hall electromotive force signal detection circuit including: a Hall element including first to fourth terminals, for generating a Hall electromotive force signal voltage; another Hall element including first to fourth terminals, for generating another Hall electromotive force signal voltage; a switching circuit for selecting a terminal position for applying a drive current from the first to fourth terminals of the Hall element; the another switching circuit for selecting a terminal position for applying a drive current from the first to fourth terminals of the another Hall element, the terminal position selected by the another switching circuit being different from the terminal position selected by the switching circuit; a chopper clock generation circuit for supplying a chopper clock signal to the switching circuit and the another switching circuit; and a Hall electromotive force signal addition circuit for simultaneously adding the Hall electromotive force signal voltage and the another Hall electromotive force signal voltage, wherein the switching circuit switches the terminal position for applying the drive current in the Hall element between the first terminal and the second terminal of the Hall element based on the chopper clock signal generated by the chopper clock generation circuit, and the another switching circuit switches the terminal position for applying the drive current in the another Hall element between the fourth terminal and the third terminal of the another Hall element based on the chopper clock signal generated by the chopper clock generation circuit.

In another embodiment, the chopper clock generation circuit is a circuit for supplying the chopper clock signal having two different phases, to the switching circuit and the other switching circuit, and wherein in the switching circuit the drive current is applied from the first terminal when the chopper clock signal is in one of the two phases and the drive current is applied from the second terminal when the chopper clock signal is in another one of the two phases, and in the another switching circuit the drive current is applied from the fourth terminal when the chopper clock signal is in one of the two phases and the drive current is applied from the third terminal when the chopper clock signal is in the another one of the two phases.

In another embodiment, a layout of the Hall electromotive force signal detection circuit is that the Hall element and the other Hall element are arranged in parallel adjacent to each other.

In yet another embodiment, the Hall element and the other Hall element are each a Hall element composed of a plurality of Hall elements connected in parallel.

In another embodiment, the number of Hall elements connected in parallel is two.

In some embodiments, there is a layout in which four Hall elements different in a direction of the drive current are arranged in parallel adjacent to each other.

In another embodiment, a Hall electromotive force signal detection circuit configured to select a terminal position for applying a drive current to a Hall element including a plurality of terminals and detect a Hall electromotive force signal voltage, the Hall electromotive force signal detection circuit including: a Hall element group composed of a plurality of Hall elements connected in parallel, each including first to fourth terminals, for generating a Hall electromotive force signal voltage; another Hall element group composed of a plurality of Hall elements connected in parallel, each including first to fourth terminals, for generating another Hall electromotive force signal voltage; a switching circuit for selecting a terminal position for applying a drive current from the terminals of the Hall element group; another switching circuit for selecting a terminal position for applying a drive current from the terminals of the another Hall element group, the terminal position selected by the another switching circuit being different from the terminal position selected by the switching circuit; and a Hall electromotive force signal addition circuit for simultaneously adding the Hall electromotive force signal voltage and the another Hall electromotive force signal voltage.

In some embodiments, a chopper clock generation circuit for supplying a chopper clock signal to the switching circuit and the another switching circuit, wherein the switching circuit switches the terminal position for applying the drive current in at least two Hall elements included in the Hall element group between the first terminal and the second terminal of the at least two Hall elements based on the chopper clock signal generated by the chopper clock generation circuit, and the other switching circuit switches the terminal position for applying the drive current in at least two Hall elements included in the other Hall element group between the fourth terminal and the third terminal of the at least two Hall elements based on the chopper clock signal generated by the chopper clock generation circuit.

In another embodiment, the chopper clock generation circuit is a circuit for supplying the chopper clock signal having two different phases, to the switching circuit and the other switching circuit, and wherein in the switching circuit the drive current is applied from the first terminal when the chopper clock signal is in one of the two phases and the drive current is applied from the second terminal when the chopper clock signal is in another one of the two phases, and in the other switching circuit the drive current is applied from the fourth terminal when the chopper clock signal is in the one of the two phases and the drive current is applied from the third terminal when the chopper clock signal is in the another one of the two phases.

In yet another embodiment, the number of the Hall elements connected in parallel is two.

Advantageous Effects of the Invention

According to the present invention, it is possible to significantly reduce the occurrence of the spike error signal which hinders accuracy enhancement of Hall electromotive force signal detection.

Moreover, since high-accuracy offset cancellation which takes into consideration the influence of the impurity concentration distribution (caused by the process gradient during semiconductor manufacture) in each Hall element can be executed at high speed in a short time, the Hall electromotive force signal detection circuit according to the present invention is effective in realizing, by use of a Hall element, a magnetic sensor required to have fast responsiveness such as a current sensor.

Furthermore, the present invention can be suitably applied to a continuous-time signal processing circuit.

BRIEF DESCRIPTION OF THE DRAWINGS

FIG. 2A to FIG. 2D are diagrams illustrating a signal waveform generated in the Hall element illustrated in FIG. 1;

FIGS. 5A and 5B are diagrams illustrating two terminals for applying a drive current of a Hall element and two terminals for detecting a Hall electromotive force signal when a phase $\phi$ of a chopper clock is switched between $\phi1$ and $\phi2$, in a first Hall element and a second Hall element;

FIG. 6 is a circuit diagram illustrating a specific example of the Hall electromotive force signal detection circuit illustrated in FIG. 4;

FIG. 7 is a diagram schematically illustrating a circuit operation in FIG. 6;

FIG. 8A to FIG. 8F are diagrams illustrating signal waveforms of voltage changes of four terminals of each of the first Hall element and the second Hall element and Hall electromotive force signals Vhall1 and Vhall2 detected respectively in the first Hall element and the second Hall element, in the Hall electromotive force signal detection circuit illustrated in FIG. 6;

FIG. 9A to FIG. 9C are diagrams illustrating an output signal waveform obtained by simultaneously adding the signal waveforms of the Hall electromotive force signals Vhall1 and Vhall2;

FIG. 12 is a circuit diagram illustrating a specific example of the Hall electromotive force signal detection circuit illustrated in FIG. 10;

DESCRIPTION OF EMBODIMENTS

First, a structure of a Hall electromotive force signal detection circuit on which the present invention is premised will be described below, with reference to FIG. 4.

Figure 1A:
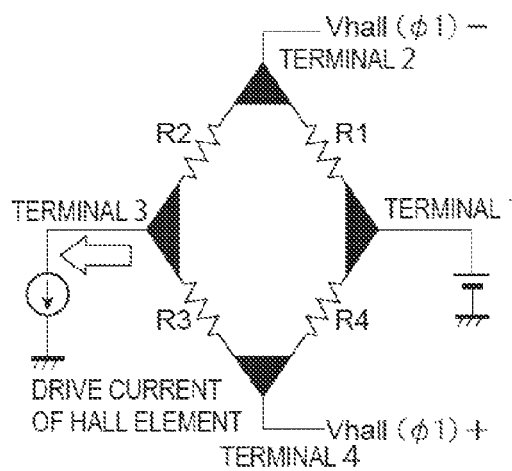
FIG. 1A and FIG. 1B are diagrams illustrating Hall electromotive force detection when a direction of a drive current for biasing a Hall element is switched between 0 degree and 90 degrees each time a phase of a chopper clock is switched between two values of $\phi1$ and $\phi2$ respectively.
Figure 1B:
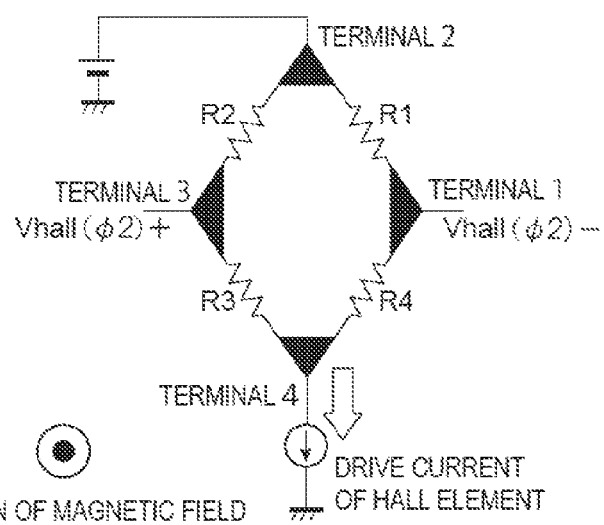
Figure 3:
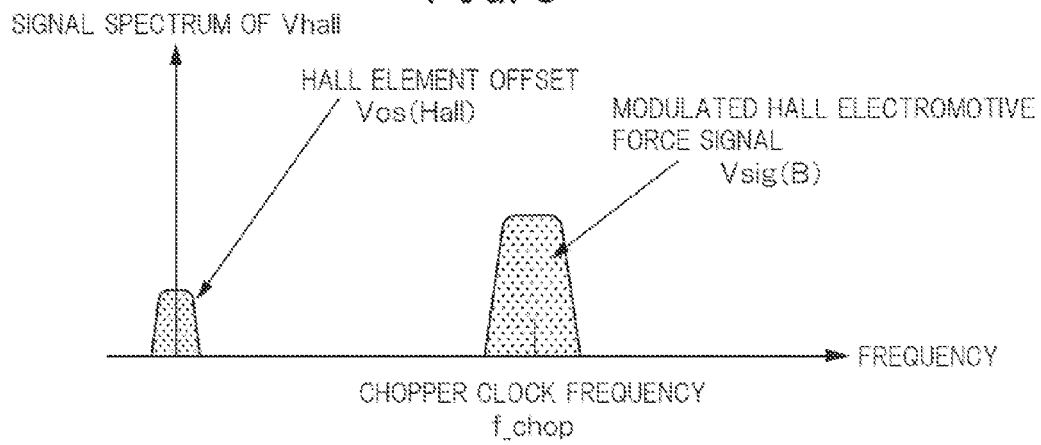
FIG. 3 is a diagram illustrating a signal spectrum of a signal Vhall generated in the Hall element.
Figure 4:
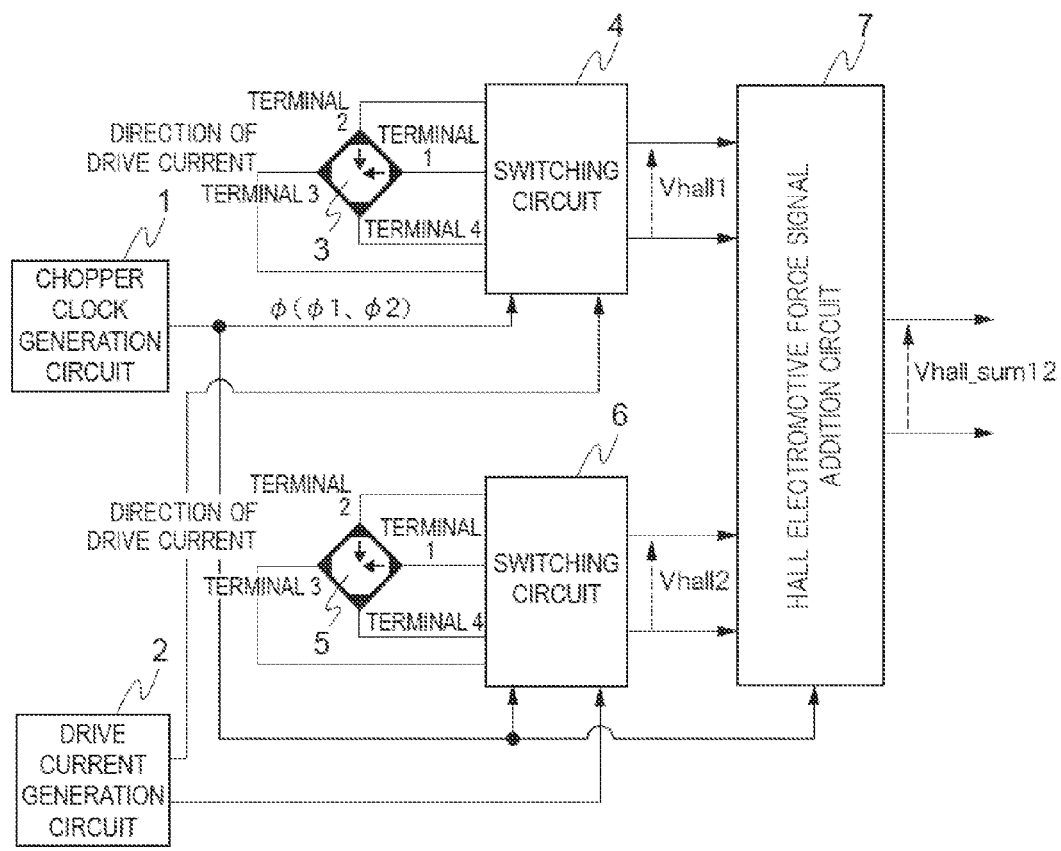
FIG. 4 is a circuit diagram illustrating a Hall electromotive force signal detection circuit on which the present invention is premised.

FIG. 4 is a circuit diagram illustrating a Hall electromotive force signal detection circuit on which the present invention is premised, and illustrates an example of a continuous-time signal processing circuit. In the drawing, reference sign 1 denotes a chopper clock generation circuit, 2 denotes a drive current generation circuit, 3 denotes a first Hall element, 4 denotes a first switching circuit, 5 denotes a second Hall element, 6 denotes a second switching circuit, and 7 denotes a Hall electromotive force signal addition circuit.

The Hall electromotive force signal detection circuit illustrated in FIG. 4 is a circuit in which Hall electromotive force signals Vhall1 and Vhall2 generated respectively in the first Hall element 3 and the second Hall element 5 are simultaneously added in continuous time by the Hall electromotive force signal addition circuit 7, to generate an output signal Vhall_sum12.

Each of the first Hall element 3 and the second Hall element 5 includes four terminals (terminals 1, 2, 3, and 4). The first switching circuit 4 and the second switching circuit 6 connected respectively to the first Hall element 3 and the second Hall element 5, according to a phase φ (φ1, φ2) of a two-phase chopper clock signal generated in the chopper clock generation circuit 1, a terminal pair for applying a drive current to drive the Hall element and a terminal pair for detecting a Hall electromotive force signal, thereby detecting the Hall electromotive force signals Vhall1 and Vhall2 generated respectively in the first Hall element 3 and the second Hall element 5. That is, offset cancellation by the spinning current method is performed for each of the first Hall element 3 and the second Hall element 5.

The above-mentioned Hall electromotive force signals Vhall1 and Vhall2 are simultaneously added by the Hall electromotive force signal addition circuit 7, as a result of which the output signal Vhall_sum12 is obtained.

FIG. 5A and FIG. 5B are diagrams illustrating two terminals for applying the drive current of the Hall element and two terminals for detecting the Hall electromotive force signal when the phase φ of the chopper clock is switched between φ1 and φ2, in the above-mentioned first and second Hall elements.

In FIG. 5A and FIG. 5B, when the chopper clock phase is φ1, the drive current of each of the first Hall element 3 and the second Hall element 5 is applied from the terminal 1 to the terminal 3, and the Hall electromotive force signal is detected as a voltage signal between the terminal 2 and the terminal 4.

Hence, it can be understood that, in each of the first Hall element 3 and the second Hall element 5, the electric potential of the terminal 1 is a higher bias voltage Vbias+ and the electric potential of the terminal 3 is a lower bias voltage Vbias− when the chopper clock phase is φ1. Likewise, it can be understood that the electric potential of the terminal 2 is the higher bias voltage Vbias+ and the electric potential of the terminal 4 is the lower bias voltage Vbias− when the chopper clock phase is φ2.

In a case of actually forming each Hall element in an IC circuit as a silicon monolithic Hall element, Vbias+ is set to a voltage such as 3 V. When the silicon monolithic Hall element has a resistance of 2 kΩ and a drive current of 0.5 mA, the bias electric potential Vbias− is lower than Vbias+ by 1 V, so that Vbias−=2 V.

Suppose each Hall element is formed as an N-type semiconductor, and a direction of a magnetic field B applied to each of the first Hall element 3 and the second Hall element 5 is perpendicular to the paper surface of FIG. 5 from the back to front sides of the paper. Then, the Hall electromotive force signal generated between the terminal 2 and the terminal 4 is a voltage signal where the terminal 2 has a positive electric potential +Vsig(B) and the terminal 4 has a negative electric potential −Vsig(B). Since the Hall electromotive force signals Vhall1 and Vhall2 are each defined as the electric potential of the terminal 2 measured with respect to the terminal 4, the Hall electromotive force signals Vhall1 and Vhall2 generated respectively in the first Hall element 3 and the second Hall element 5 when the chopper clock signal is φ1 are each detected as +2Vsig(B).

Likewise, the Hall electromotive force signals Vhall1 and Vhall2 generated respectively in the first Hall element 3 and the second Hall element 5 when the chopper clock phase is φ2 are each detected as −2Vsig(B).

Table 1 summarizes the terminal pair for applying the drive current in the first Hall element and the second Hall element. Table 2 summarizes the terminal pair for detecting the Hall electromotive force signal in the first Hall element and the second Hall element.

When the drive current is applied to each of the first Hall element and the second Hall element according to Table 1 and the Hall electromotive force signal is detected according to Table 2, the Hall electromotive force signals Vhall1 and Vhall2 in the respective first Hall element and second Hall element are detected as shown in Table 3.

TABLE 1

Terminal pair for applying drive current in first Hall element and second Hall element.

| Drive current application | Chopper clock phase | |
| --- | --- | --- |
| | φ1 | φ2 |
| Vhall1 | Apply from terminal 1 to terminal 3 (0-degree direction) | Apply from terminal 2 to terminal 4 (90-degree direction) |
| Vhall2 | Apply from terminal 1 to terminal 3 (0-degree direction) | Apply from terminal 2 to terminal 4 (90-degree direction) |

TABLE 2

Terminal pair for detecting Hall electromotive force signal in first Hall element and second Hall element

| Terminal pair for detecting Hall electromotive force signal | Chopper clock phase | |
|---|---|---|
| | φ1 | φ2 |
| Vhall1 | Measure electric potential of terminal 2 with respect to terminal 4 | Measure electric potential of terminal 1 with respect to terminal 3 |
| Vhall2 | Measure electric potential of terminal 2 with respect to terminal 4 | Measure electric potential of terminal 1 with respect to terminal 3 |

TABLE 3

Detection of Hall electromotive force signals Vhall1 and Vhall2

| Hall electromotive force signal | Chopper clock phase | |
|---|---|---|
| | φ1 | φ2 |
| Vhall1 | +2Vsig(B) + Vos(Hall, 0°) | −2Vsig(B) + Vos(Hall, 90°) |
| Vhall2 | +2Vsig(B) + Vos(Hall, 0°) | −2Vsig(B) + Vos(Hall, 90°) |

Though the first Hall element and the second Hall element are two different Hall elements, the value Vsig(B) common to the first Hall element and the second Hall element are used here, based on an assumption that the first Hall element and the second Hall element have identical magnetic sensitivity. This assumption is appropriate because, in a case where the first Hall element and the second Hall element are formed by a semiconductor IC process and arranged in proximity to each other in an IC, the first Hall element and the second Hall element are uniform in process gradient during semiconductor manufacture.

On the other hand, the offset voltage slightly differs depending on the drive current application direction in such a manner that the offset voltage when the drive current is applied from the terminal 1 to the terminal 3 (applied in the 0-degree direction) is Vos(Hall,0°) and the offset voltage when the drive current is applied from the terminal 2 to the terminal 4 (applied in the 90-degree direction) is Vos(Hall, 90°), because there is an impurity concentration distribution in each Hall element due to a process gradient during semiconductor manufacture as noted above. In a Hall element manufactured by a CMOS semiconductor process, the difference between Vos(Hall,0°) and Vos(Hall,90°) is typically about 10 μV.

Since there is a difference of about 10 μV between Vos(Hall,0°) and Vos(Hall,90°), an offset of about 10 μV remains even after offset cancellation, in the Hall electromotive force signal detection circuit illustrated in FIG. 4, FIG. 5A and FIG. 5B. That is, not only the problem of the spike error signal but also the problem of offset cancellation accuracy exists in FIG. 4, FIG. 5A and FIG. 5B.

FIG. 6 is a circuit diagram illustrating a specific example of the Hall electromotive force signal detection circuit illustrated in FIG. 4, where a chopper amplifier and a current feedback amplifier are combined with the spinning current method of the Hall element. The circuit structure illustrated in FIG. 6 is an example of a Hall electromotive force signal processing circuit by a continuous-time signal processing system, because discrete-time processing (sampling) is not performed. In the drawing, reference sign 70 denotes a signal amplification circuit for adding simultaneously and amplifying the Hall electromotive force signal Vhall1 generated in the first Hall element and the Hall electromotive force signal Vhall2 generated in the second Hall element, 71 denotes a first transistor differential pair (Gm,1,1), 72 denotes a second transistor differential pair (Gm,1,2), 73 denotes a fourth switching circuit, 74 denotes a fourth transistor differential pair (Gm,2), 75 denotes a fifth switching circuit, and 76 denotes a Hall electromotive force signal addition circuit output stage. Here, the components having the same functions as those in FIG. 4 are given the same reference signs. A third Hall element and a third switching circuit will be described in the description of the present invention with reference to FIG. 10.

In FIG. 6, the Hall electromotive force signals Vhall1 and Vhall2 generated in the first Hall element 3 and the second Hall element 5 are converted from voltage signals to current signals by the first transistor differential pair 71 and the second transistor differential pair 72 and as a result become output currents I1,1 and I1,2 of the first transistor differential pair 71 and the second transistor differential pair 72, respectively. These currents I1,1 and I1,2 are simultaneously added as current signals. The circuit functions so that a current signal sum of the current signals obtained by the simultaneous addition and an output current signal of the fourth transistor differential pair 74 driven by a feedback voltage Vfb given by Expression 2 is 0. Accordingly, the signal Vhall_sum12 obtained by adding simultaneously and amplifying the Hall electromotive force signals Vhall1 and Vhall2 generated respectively in the first Hall element 3 and the second Hall element 5 can be yielded as an output signal of the circuit illustrated in FIG. 6, as shown by Expression 3.

FIG. 7 is a diagram schematically illustrating a circuit operation in FIG. 6. In the first switching circuit 4 and the second switching circuit 6, the Hall electromotive force signals Vhall1 and Vhall2 generated respectively in the first Hall element 3 and the second Hall element 5 are detected in a form in which the signal component Vsig(B) corresponding to the magnetic field B is modulated by the chopper clock. However, after Vhall1 and Vhall2 are simultaneously added, they are demodulated by the chopper clock.

Expression 2:

Feedback from output voltage Vout of signal amplification circuit [Math. 2]

$$Vfb = \frac{R1}{R1 + R2} Vout$$

Expression 3:

Expression of signal amplification of Hall electromotive force signal (prior art) [Math. 3]

$$Vhall\_sum12 = \left(1 + \frac{R2}{R1}\right)\left\{\left(\frac{Gm, 1, 1}{Gm, 2}\right)Vhall1 + \left(\frac{Gm, 1, 2}{Gm, 2}\right)Vhall2\right\}$$

FIG. 8A to FIG. 8F are diagrams illustrating signal waveforms of voltage changes of the four terminals of each of the first Hall element and the second Hall element and the Hall electromotive force signals Vhall1 and Vhall2 detected respectively in the first Hall element and the second Hall element, in the Hall electromotive force signal detection circuit illustrated in FIG. 6. Note that each diagram of a signal waveform of Hall electromotive force signal detection as in FIG. 8A to FIG. 8F and FIG. 6 is intended to illustrate the temporal change of the signal waveform according to the chopper clock, and so is based on an assumption that the Hall element offset is 0.

As illustrated in FIG. 8(a) to (f), the Hall electromotive force signals Vhall1 and Vhall2 are detected in a form of being modulated by the chopper clock signal. However, after the Hall electromotive force signals Vhall1 and Vhall2 are converted from voltage signals to current signals, they are demodulated by the fifth switching circuit 75 in the Hall electromotive force signal detection circuit illustrated in FIG. 6. Therefore, the output signal Vhall_sum12 of the Hall electromotive force signal detection circuit illustrated in FIG. 6 has a signal waveform as illustrated in FIG. 9(c).

FIG. 9(a) to (c) is a diagram illustrating the output signal waveform obtained by simultaneously adding the signal waveforms of the Hall electromotive force signals Vhall1 and Vhall2. As can be understood from the signal waveform illustrated in FIG. 9, in the Hall electromotive force signal detection circuit illustrated in FIG. 6, the switching operation of switching between the terminal pair used for applying the drive current and the terminal pair used for detecting the Hall electromotive force signal is performed in each Hall element (the first Hall element 3 and the second Hall element 5) when the chopper clock signal is switched, so that a temporal transition when transitioning from the bias voltage Vbias+ or Vbias− determined by drive current application to the voltage of the Hall electromotive force signal appears as a spike error signal in the output signal Vhall_sum12.

As mentioned above, the Hall electromotive force signal detection circuit illustrated in FIG. 6 corresponds to the continuous-time signal processing system that does not perform discrete-time processing (sampling). Accordingly, the spike error signal is directly output as an output signal, causing a decrease in accuracy of the Hall electromotive force signal detection circuit.

Thus, in the Hall element, the spike error signal occurs upon switching the chopper clock signal, in the case of performing offset cancellation by the spinning current method. This hinders accuracy enhancement of Hall electromotive force signal detection. This hindrance is particularly serious in the continuous-time signal processing system that does not perform discrete-time processing (sampling).

An embodiment of the present invention will be described below, with reference to drawings.

Figure 10:
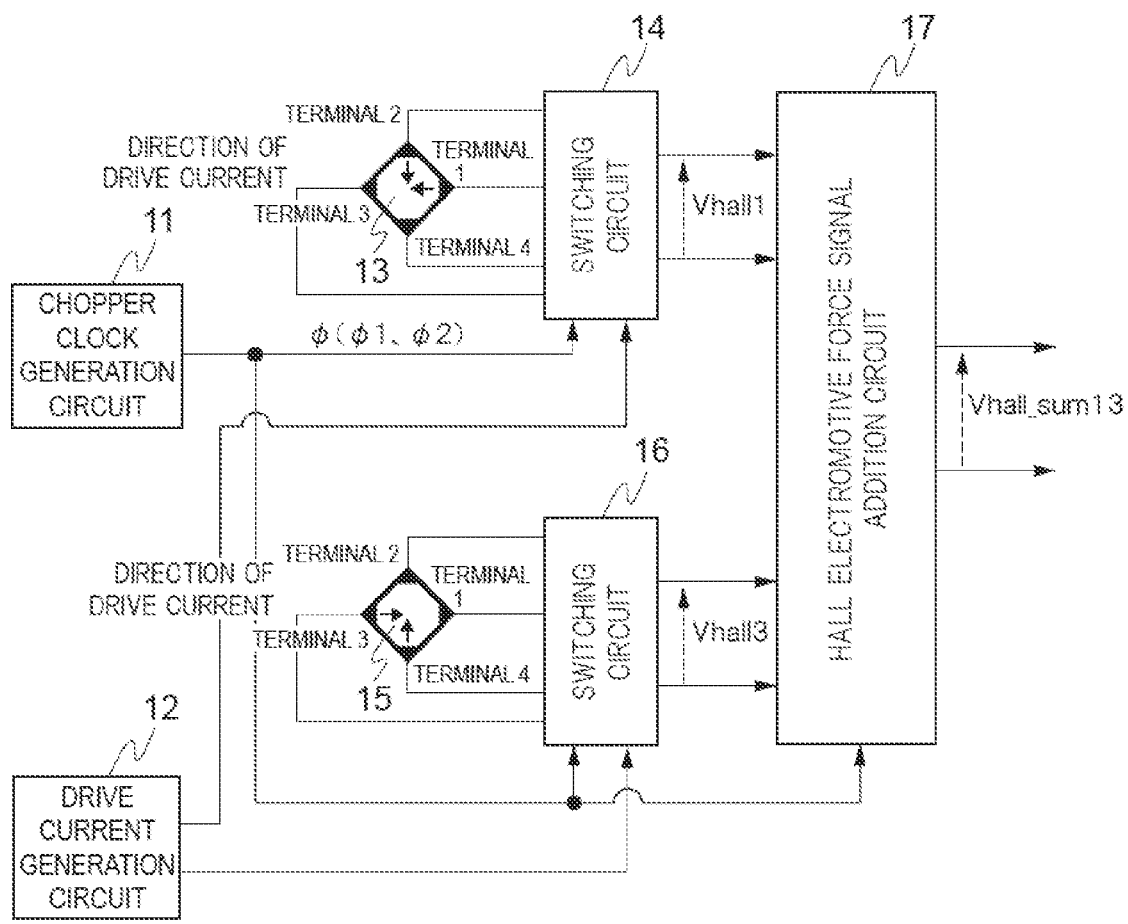
FIG. 10 is a circuit diagram illustrating an embodiment of a Hall electromotive force signal detection circuit according to the present invention.

FIG. 10 is a circuit diagram illustrating an embodiment of a Hall electromotive force signal detection circuit according to the present invention. In the drawing, reference sign 11 denotes a chopper clock generation circuit, 12 denotes a drive current generation circuit, 13 denotes a first Hall element, 14 denotes a first switching circuit, 15 denotes a third Hall element, 16 denotes a third switching circuit, and 17 denotes a Hall electromotive force signal addition circuit.

The Hall electromotive force signal detection circuit according to the present invention is configured to select a terminal position for applying a drive current from four terminals (terminals 1 to 4) of each of the first Hall element 13 and the third Hall element 15 and detect a Hall electromotive force signal voltage.

The first Hall element (a Hall element) 13 includes first to fourth terminals, and generates a Hall electromotive force signal voltage Vhall1. The third Hall element (an other Hall element) 15 includes first to fourth terminals, and generates an other Hall electromotive force signal voltage Vhall3.

The first switching circuit (a switching circuit) 14 selects a terminal position for applying a drive current from the four terminals of the first Hall element 13. The third switching circuit (an other switching circuit) 16 selects a terminal position for applying a drive current from the four terminals of the third Hall element 15, the terminal position selected by the third switching circuit 16 being different from the terminal position selected by the first switching circuit 14.

The chopper clock generation circuit 11 supplies a chopper clock signal φ1, φ2 having two different phases to the first switching circuit 14, and also supplies the chopper clock signal φ1, φ2 having the two different phases to the third switching circuit 16. The Hall electromotive force signal addition circuit simultaneously adds the Hall electromotive force signal voltage Vhall1 and the other Hall electromotive force signal voltage Vhall3.

The first switching circuit 14 switches the terminal position for applying the drive current in the first Hall element 13 between the first terminal and the second terminal of the Hall element, based on the chopper clock signal φ1, φ2 generated by the chopper clock generation circuit 11. The third switching circuit 16 switches the terminal position for applying the drive current in the third Hall element 15 between the fourth terminal and the third terminal of the Hall element, based on the chopper clock signal φ1, φ2 generated by the chopper clock generation circuit 11.

In the first switching circuit 14 the drive current is applied from the terminal 1 when the chopper clock signal is in the phase φ1, and the drive current is applied from the terminal 2 when the chopper clock signal is in the other phase φ2. In the third switching circuit 16 the drive current is applied from the terminal 4 when the chopper clock signal is in the phase φ1, and the drive current is applied from the terminal 3 when the chopper clock signal is in the other phase φ2.

Like the circuit diagram in FIG. 4 on which the present invention is premised, the circuit diagram in FIG. 10 illustrates a Hall electromotive force detection circuit for performing signal detection in continuous time by simultaneously adding the Hall electromotive force signals Vhall1 and Vhall3 generated respectively in the first Hall element 13 and the third Hall element 15 as two Hall elements. The circuit diagram in FIG. 10 is the same as the circuit diagram in FIG. 4 in that the circuit structure includes the two switching circuits (the first switching circuit 14 and the third switching circuit 16), the chopper clock generation circuit 11, the drive current generation circuit 12, and the Hall electromotive force signal addition circuit 17.

However, the circuit diagram in FIG. 10 according to the embodiment of the present invention differs from the circuit diagram in FIG. 4 in that, in the circuit diagram in FIG. 10, the position of the terminal pair for applying the drive current of the Hall element and the position of the terminal pair for detecting the Hall electromotive force signal are different between the two Hall elements that are the first Hall element 13 and the third Hall element 15.

Figure 11A:
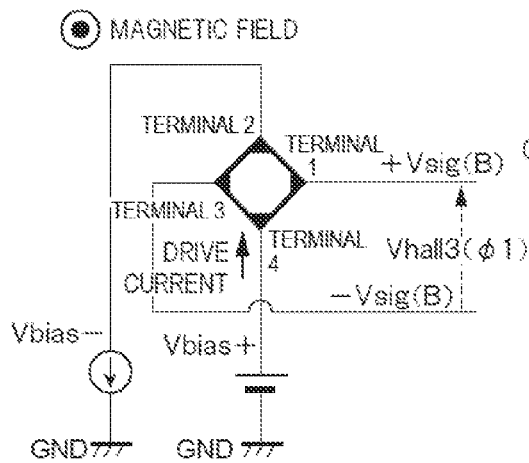
FIG. 11A and FIG. 11B are diagrams illustrating a position of a terminal pair for determining a direction of applying a drive current of a third Hall element in the circuit diagram in FIG. 10, and a position of a terminal pair for detecting a Hall electromotive force signal of the third Hall element.
Figure 11B:
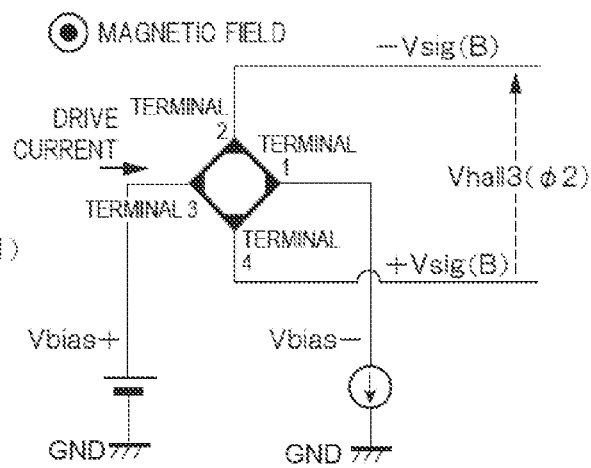

FIG. 11A and FIG. 11B are diagrams illustrating the position of the terminal pair for determining the direction of applying the drive current of the third Hall element in the circuit diagram in FIG. 10, and the position of the terminal pair for detecting the Hall electromotive force signal of the third Hall element. Table 4 shows the position of the terminal pair for determining the direction of applying the drive current of the third Hall element 15. Table 5 shows the position of the terminal pair for detecting the Hall electromotive force signal of the third Hall element 15.

In a case where the Hall electromotive force signal in the third Hall element 15 is detected in this way, the Hall electromotive force signal Vhall3 in the third Hall element 15 is detected as shown in Table 6.

TABLE 4

Terminal pair for applying drive current in third Hall element

| Drive current application | Chopper clock phase | |
|---|---|---|
| | φ1 | φ2 |
| Vhall3 | Apply from terminal 4 to terminal 2 (270-degree direction) | Apply from terminal 3 to terminal 1 (180-degree direction) |

TABLE 5

Terminal pair for detecting Hall electromotive force signal in third Hall element

| Terminal pair for detecting Hall electromotive force signal | Chopper clock phase | |
|---|---|---|
| | φ1 | φ2 |
| Vhall3 | Measure electric potential of terminal 1 with respect to terminal 3 | Measure electric potential of terminal 2 with respect to terminal 4 |

TABLE 6

Detection of Hall electromotive force signal Vhall3

| Hall electromotive force signal | Chopper clock phase | |
|---|---|---|
| | φ1 | φ2 |
| Vhall3 | +2Vsig(B) + Vos (Hall, 270°) | −2Vsig(B) + Vos (Hall, 180°) |

The value Vsig(B) common to the first Hall element 13 and the third Hall element 15 is used here as the signal component corresponding to the magnetic field B, based on an assumption that the first Hall element 13 and the third Hall element 15 have identical magnetic sensitivity.

On the other hand, as the offset component of the third Hall element, the values Vos(Hall,270°) and Vos(Hall,180°) different from the values Vos(Hall,0°) and Vos(Hall,90°) of the first Hall element are assumed. This is because, since there is an impurity concentration distribution in each Hall element due to a process gradient during semiconductor manufacture, the depletion layer developed in the Hall element varies depending on from which of the four terminals (terminals 1, 2, 3, and 4) of the Hall element the drive current is applied, as noted above.

FIG. 12 is a circuit diagram illustrating a specific example of the Hall electromotive force signal detection circuit illustrated in FIG. 10, where a chopper amplifier and a current feedback amplifier are combined with the spinning current method of the Hall element. The circuit structure illustrated in FIG. 12 is an example of a Hall electromotive force signal processing circuit by a continuous-time signal processing system, because discrete-time processing (sampling) is not performed. In the drawing, reference sign 80 denotes a signal amplification circuit for adding simultaneously and amplifying the Hall electromotive force signal Vhall1 generated in the first Hall element and the Hall electromotive force signal Vhall3 generated in the third Hall element, 81 denotes a first transistor differential pair (Gm,1,1), 82 denotes a third transistor differential pair (Gm,1,3), 83 denotes a fourth switching circuit, 84 denotes a fourth transistor differential pair (Gm,2), 85 denotes a fifth switching circuit, and 86 denotes a Hall electromotive force signal addition circuit output stage. Here, the components having the same functions as those in FIG. 10 are given the same reference signs.

In FIG. 12, the Hall electromotive force signal Vhall1 generated in the first Hall element 13 and the Hall electromotive force signal Vhall3 generated in the third Hall element 15 are simultaneously added in continuous time to generate an output voltage signal Vhall_sum13, according to Expression 4.

Expression 4:

Expression of signal amplification of Hall electromotive force signal [Math. 4]

$$Vhall\_sum13 = \left(1 + \frac{R2}{R1}\right)\left\{\left(\frac{Gm,1,1}{Gm,2}\right)Vhall1 + \left(\frac{Gm,1,3}{Gm,2}\right)Vhall3\right\}$$

In FIG. 12, it should be noted that, regarding the two Hall elements (the first Hall element and the third Hall element), the switching operation differs between the two switching circuits (the first switching circuit and the third switching circuit) each of which selectively switches the position of the terminal pair for applying the drive current of the Hall element and selectively switches the position of the terminal pair for extracting the Hall electromotive force signal according to the phase of the chopper clock signal.

Figure 13:
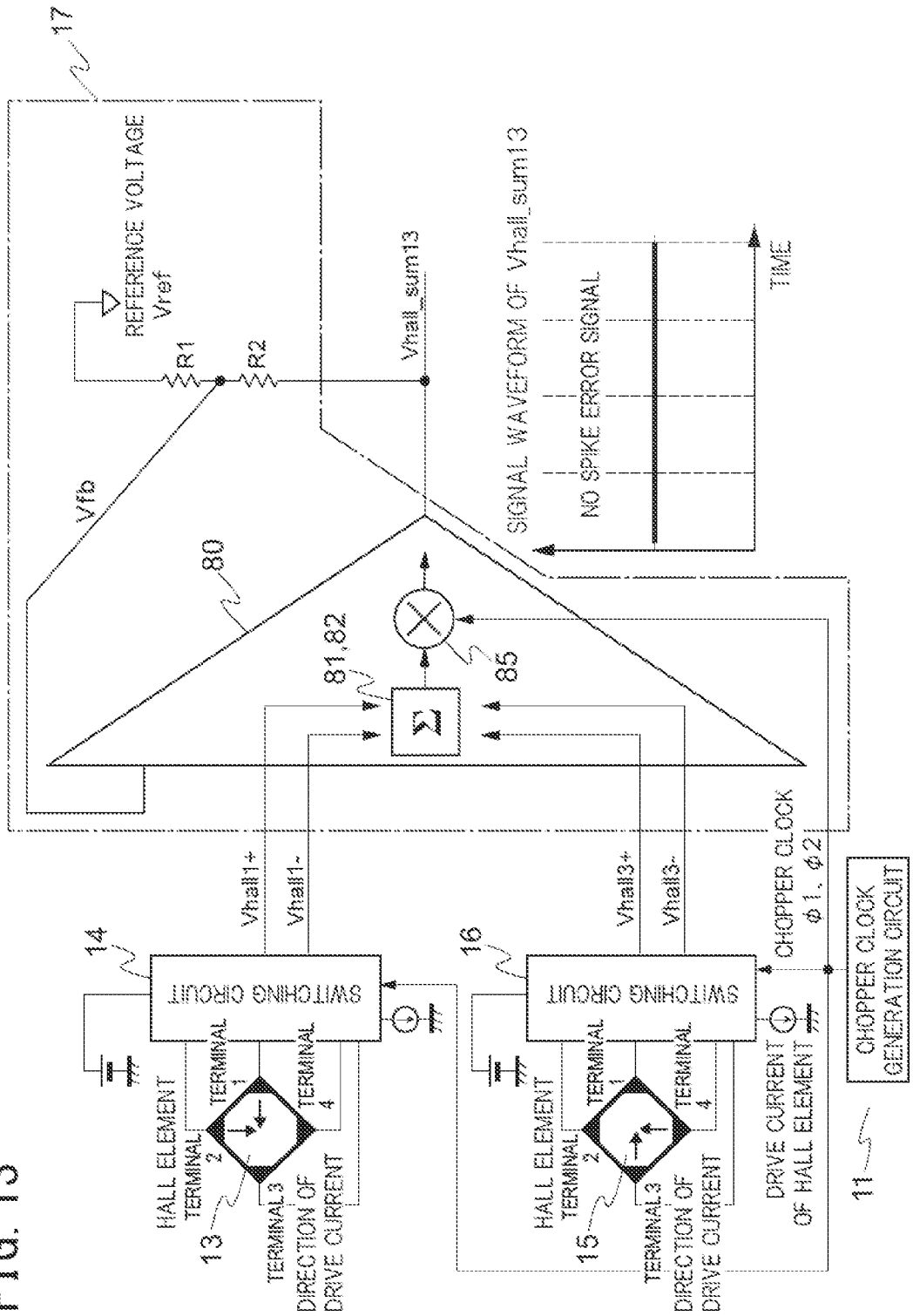
FIG. 13 is a diagram schematically illustrating a circuit operation in FIG. 12.

FIG. 13 is a diagram schematically illustrating a circuit operation in FIG. 12. In the first switching circuit 14 and the third switching circuit 16, the Hall electromotive force signals Vhall1 and Vhall3 generated respectively in the first Hall element 13 and the third Hall element 15 are detected in a form in which the signal component Vsig(B) corresponding to the magnetic field B is modulated by the chopper clock. However, after Vhall1 and Vhall3 are simultaneously added, they are demodulated by the chopper clock.

Figure 14:
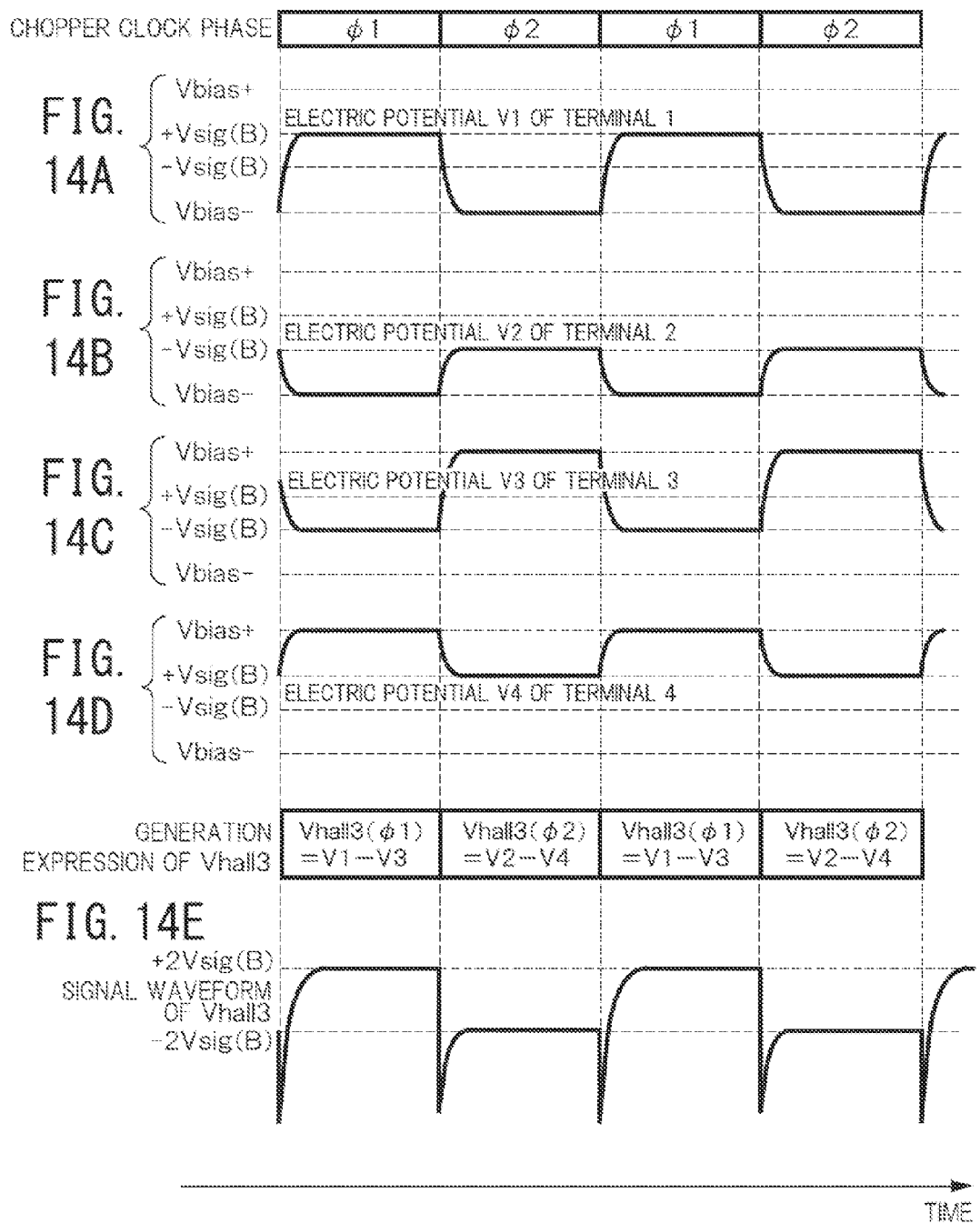
FIG. 14A to FIG. 14E are diagrams illustrating signal waveforms of an electric potential of each terminal in the third Hall element and a Hall electromotive force signal Vhall3 detected from the third Hall element, in the Hall electromotive force signal detection circuit illustrated in FIG. 12.
Figure 15:
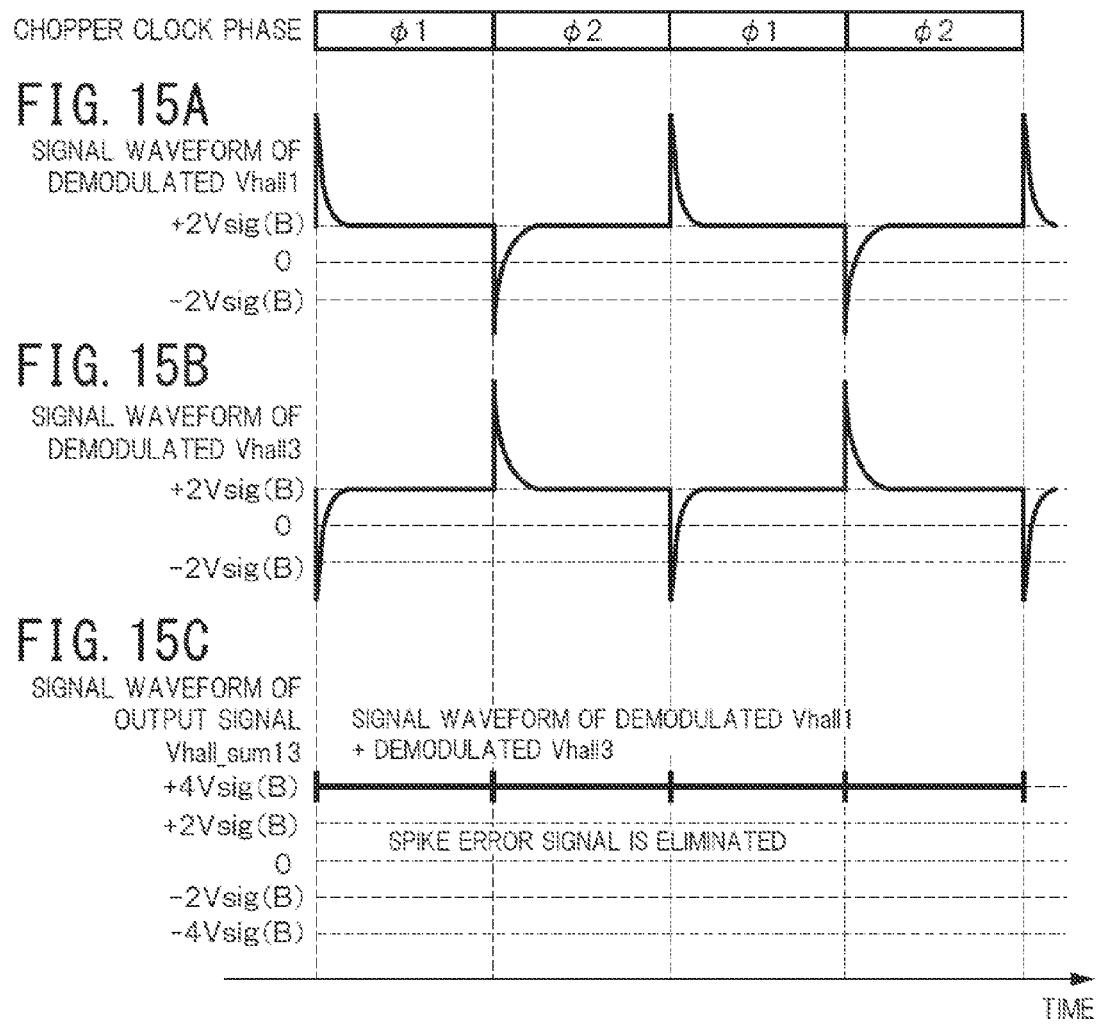
FIG. 15A to FIG. 15C are diagrams illustrating an output signal waveform obtained by simultaneously adding the signal waveforms of the Hall electromotive force signals Vhall1 and Vhall3.

FIG. 14A to FIG. E are diagrams illustrating signal waveforms of the electric potential of each terminal in the third Hall element and the Hall electromotive force signal Vhall3 detected from the third Hall element, in the Hall electromotive force signal detection circuit illustrated in FIG. 12. Meanwhile, the signal waveforms of the electric potential of each terminal in the first Hall element 13 and the Hall electromotive force signal Vhall1 detected from the first Hall element 13 are the same as the signal waveforms illustrated in FIG. 8A to 8D. In the Hall electromotive force signal detection circuit according to the present invention, the Hall electromotive force signal Vhall1 generated in the first Hall element 13 and the Hall electromotive force signal Vhall3 generated in the third Hall element 15 are simultaneously added in continuous time. As a result of simultaneously adding Vhall1 and Vhall3 in continuous time, an output signal waveform illustrated in FIG. 15(*a*) to (*c*) is obtained.

FIG. 15A to 15C are diagrams illustrating the output signal waveform obtained by simultaneously adding the signal waveforms of the Hall electromotive force signals Vhall1 and Vhall3. As can be understood from FIG. 15A to 15C, the Hall electromotive force signal detection circuit according to the present invention can significantly reduce the spike error signal which occurs upon switching the chopper clock signal, by simultaneously adding the two Hall electromotive force signals. Therefore, the Hall electromotive force signal detection circuit according to the present invention is very effective in achieving high-accuracy Hall electromotive force signal detection by a circuit structure of a continuous-time signal processing system.

The Hall electromotive force signal detection circuit according to the present invention has a feature that the direction of applying the drive current of the Hall element differs by 180 degrees between the first Hall element 13 and the third Hall element 15, as summarized in Table 7. That is, in the Hall electromotive force signal detection circuit according to the present invention, the drive current is applied in the directions of 0 degree and 90 degrees in the first Hall element 13, whereas the drive current is applied in the directions of 270 degrees and 180 degrees in the third Hall element 15.

When making the drive current application direction different by 180 degrees between the first Hall element 13 and the third Hall element 15 in this way, the offset component included in the output signal Vhall_sum13 after the signal demodulation by the chopper clock is as shown in Table 8.

TABLE 7

Terminal pair for applying drive current in first Hall element and third Hall element

| Drive current application | Chopper clock phase | |
|---|---|---|
| | φ1 | φ2 |
| Vhall1 | Apply from terminal 1 to terminal 3 (0-degree direction) | Apply from terminal 2 to terminal 4 (90-degree direction) |
| Vhall3 | Apply from terminal 4 to terminal 2 (270-degree direction) | Apply from terminal 3 to terminal 1 (180-degree direction) |

TABLE 8

Offset of first Hall element and third Hall element included in Vhall_sum13

| Offset after chopper demodulation | Chopper clock phase | |
|---|---|---|
| | φ1 | φ2 |
| First Hall element | +Vos(Hall, 0°) | −Vos(Hall, 90°) |
| Third Hall element | +Vos(Hall, 270°) | −Vos(Hall, 180°) |

As can be understood from Table 8, in the Hall electromotive force signal detection circuit according to the present invention, four possible offset voltages Vos(Hall,0°), Vos(Hall,90°), Vos(Hall,180°), and Vos(Hall,270°) of the Hall elements can be canceled out through addition and subtraction while the chopper clock signal is switched between two phases of φ1 and φ2.

That is, the influence of the impurity concentration distribution in each Hall element can be averaged in a short time of the phases φ1 and φ2. This enables both high-accuracy offset cancelation and fast responsiveness to be achieved.

Figure 16:
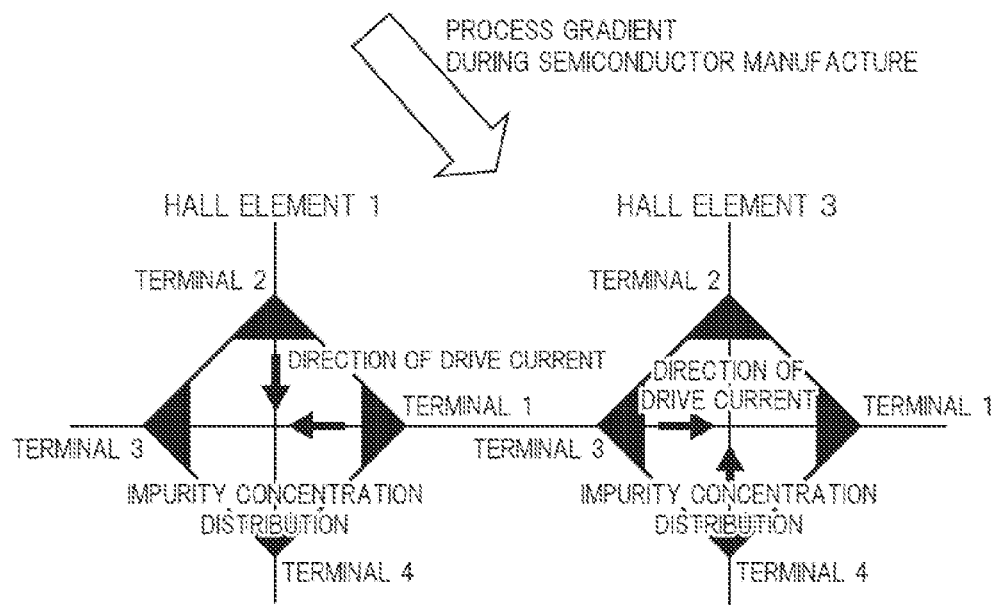
FIG. 16 is a diagram illustrating an IC layout of two Hall elements in the Hall electromotive force signal detection circuit according to the present invention and the spinning current method in the two Hall elements, in a case where there is an impurity concentration distribution in each Hall element due to a process gradient during semiconductor manufacture when manufacturing an IC circuit.

FIG. 16 is a diagram illustrating an IC layout of two Hall elements in the Hall electromotive force signal detection circuit according to the present invention and the spinning current method in the two Hall elements, in a case where there is an impurity concentration distribution in each Hall element due to a process gradient during semiconductor manufacture when manufacturing an IC circuit.

Here, the Hall element layout is a layout in which the two Hall elements are arranged in parallel adjacent to each other. By this layout, even the influence, on the offset, of the impurity concentration distribution in each Hall element due to the process gradient during semiconductor manufacture when manufacturing the IC circuit can be effectively canceled out in the Hall electromotive force signal detection circuit according to the present invention.

In the method disclosed in Patent Document 1, on the other hand, the process of averaging the four offset voltages Vos(Hall,0°), Vos(Hall,90°), Vos(Hall,180°), and Vos(Hall, 270°) mentioned above does not complete within the two periods of φ1 and φ2 but needs additional two periods of φ3 and φ4, i.e. needs four periods in total.

Moreover, by making the drive current application direction different by 180 degrees between the first Hall element and the third Hall element, high-accuracy offset cancelation which takes into consideration the influence of the impurity concentration distribution in each Hall element can be executed at high speed.

In the above description of the Hall electromotive force signal detection circuit according to the present invention, the number of Hall elements is two, as an example. However, the number of Hall elements in the present invention is not limited to two but may be an arbitrary even number, as can be understood from the above description. Typically, increasing the number of Hall elements is effective in improving magnetic sensitivity and realizing a high-sensitivity magnetic sensor in Hall electromotive force signal detection.

Figure 17:
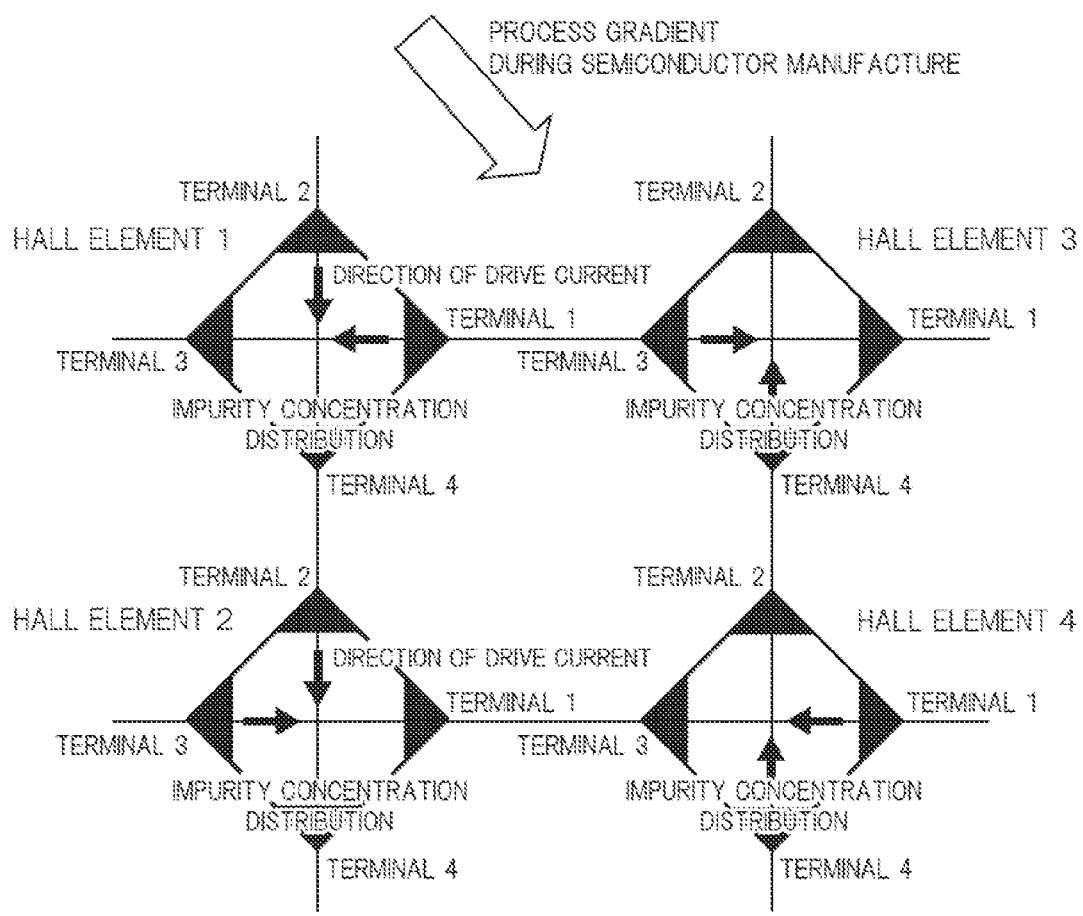
FIG. 17 is a diagram illustrating an example of an IC layout in a case of using four Hall elements in the Hall electromotive force signal detection circuit according to the present invention.

FIG. 17 is a diagram illustrating an example of an IC layout in a case of using four Hall elements, in the Hall electromotive force signal detection circuit according to the present invention. Here, the Hall element layout may be a layout in which the four Hall elements are arranged in parallel adjacent to each other. In the case of using such four Hall elements, the effect of canceling out the influence of the process gradient during semiconductor manufacture can be improved by arranging the four Hall elements at the vertices of a square, as compared with the case of using two Hall elements.

Figure 18:
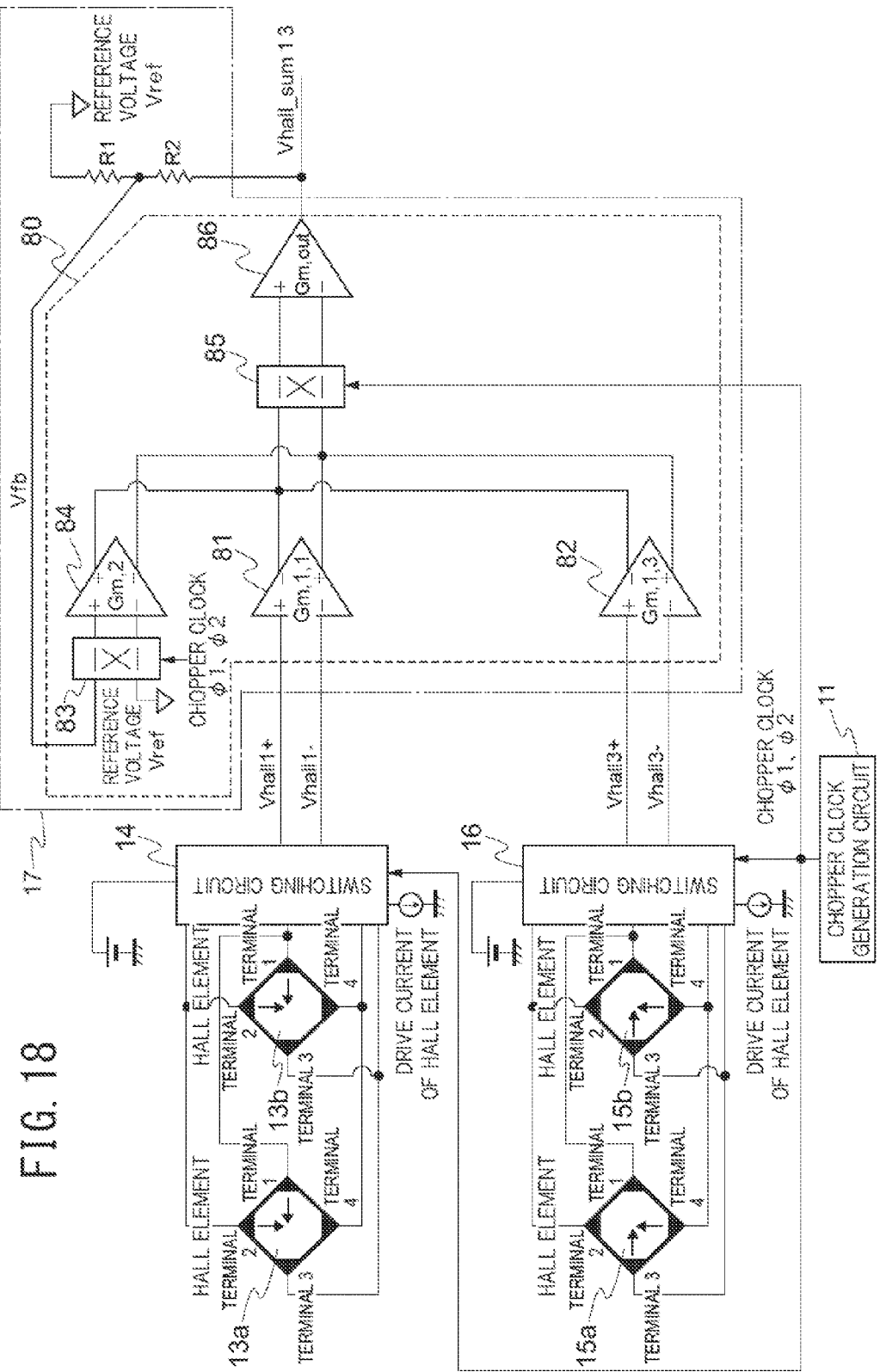
FIG. 18 is a circuit diagram illustrating another specific example of the Hall electromotive force signal detection circuit illustrated in FIG. 10.

FIG. 18 is a circuit diagram illustrating another specific example of the Hall electromotive force signal detection circuit illustrated in FIG. 10. In the drawing, reference signs 13a and 13b denote first Hall elements, and 15a and 15b denote third Hall elements. Here, the components having the same functions as those in FIG. 12 are given the same reference signs.

The Hall electromotive force detection circuit illustrated in FIG. 18 is a Hall electromotive force detection circuit in which the number of Hall elements connected to the first switching circuit 14 and the number of Hall elements connected to the third switching circuit 16 are each increased from one to two, as compared with FIG. 12.

The Hall electromotive force signal detection circuit according to the present invention is a Hall electromotive force signal detection circuit configured to select a terminal position for applying a drive current to a Hall element including a plurality of terminals and detect a Hall electromotive force signal voltage. A Hall element group 13a, 13b includes first to fourth terminals for each Hall element, generates a Hall electromotive force signal voltage, and is composed of a plurality of Hall elements connected in parallel. An other Hall element group 15a, 15b includes first to fourth terminals for each Hall element, generates an other Hall electromotive force signal voltage, and is composed of a plurality of Hall elements connected in parallel.

A switching circuit selects a terminal position for applying a drive current from the four terminals of the Hall element group. Another switching circuit selects a terminal position for applying a drive current from the four terminals of the other Hall element group, the terminal position selected by the other switching circuit being different from the terminal position selected by the switching circuit.

A chopper clock generation circuit supplies a chopper clock signal having two different phases to the switching circuit, and also supplies the chopper clock signal having the two different phases to the other switching circuit. A Hall electromotive force signal addition circuit simultaneously adds the Hall electromotive force signal voltage and the other Hall electromotive force signal voltage.

Though FIG. 18 illustrates the case where the number of Hall elements connected in parallel is two, the number of Hall elements is not limited to two, but may be set to a desired number such as four or more according to need.

Here, the two Hall elements 13a and 13b connected to the first switching circuit 14 are connected in parallel, and the two Hall elements 15a and 15b connected to the third switching circuit 16 are connected in parallel. Accordingly, an output impedance of the two Hall elements as seen from the transistor differential pair (Gm,1,1) or the transistor differential pair (Gm,1,3) is reduced to approximately half of an output impedance of the Hall element in FIG. 12.

Immediately after the chopper clock is switched, the two terminals which have been used for applying the drive current to the Hall element are switched to the terminals for extracting the Hall electromotive force signal. A charge discharge phenomenon when the electric potentials of the two terminals change from the bias voltages Vbias+ and Vbias− to the electric potential of the Hall electromotive force signal causes a spike error signal to occur. A time constant τ of the charge discharge phenomenon can be represented by a product of an output impedance R of the two Hall elements as seen from the transistor differential pair (Gm,1,1) or the transistor differential pair (Gm,1,3) and a stray capacitance C in the signal node, that is, τ=RC. By connecting the Hall elements in parallel to reduce the output impedance R of the Hall elements, it is possible to reduce the time constant τ of the charge discharge phenomenon, thus enabling the spike error signal which occurs upon switching the chopper clock signal to be eliminated in a short time. For the reason described above, the Hall electromotive force detection circuit illustrated in FIG. 18 can eliminate the spike error signal which occurs upon switching the chopper clock signal in a short time, as compared with the Hall electromotive force signal detection circuit illustrated in FIG. 12.

Figures 19A, 19B:
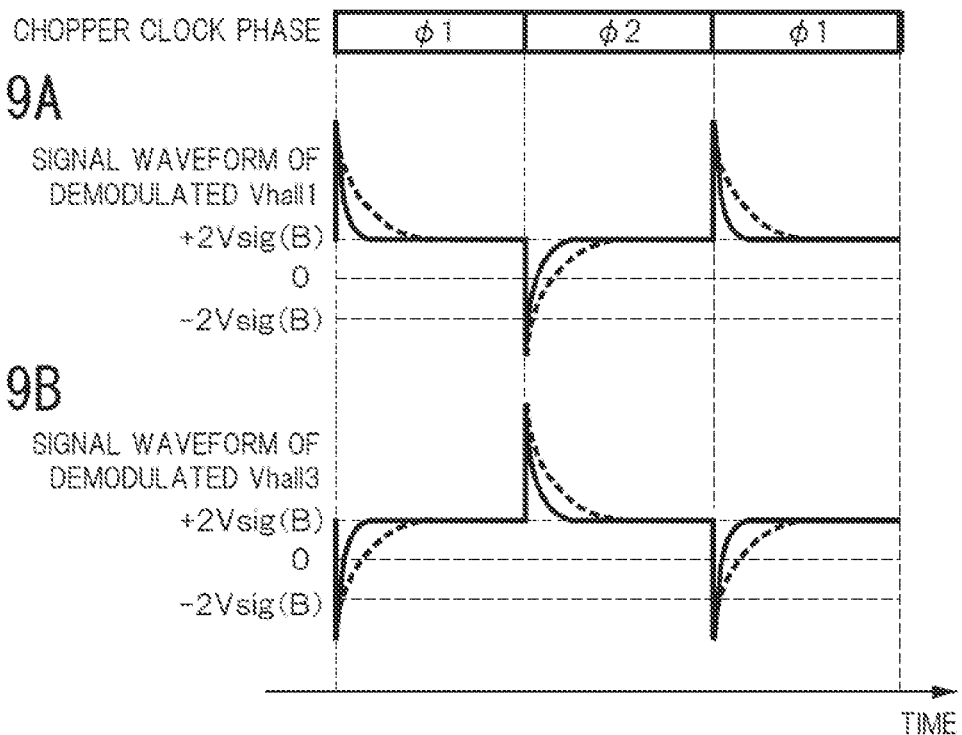
FIG. 19A and FIG. 19B are diagrams illustrating states of a spike error signal (solid line) in the Hall electromotive force signal detection circuit illustrated in FIG. 18 and a spike error signal (dotted line) in the Hall electromotive force signal detection circuit illustrated in FIG. 12.

FIGS. 19A and 19B are diagrams illustrating the states of the spike error signal (solid line) in the Hall electromotive force signal detection circuit in FIG. 18 and the spike error signal (dotted line) in the Hall electromotive force signal detection circuit in FIG. 12.

As can be understood from FIGS. 19(a) and (b), the spike error signal which occurs upon chopper clock switching is eliminated in a short time in the Hall electromotive force signal detection circuit in FIG. 18, so that the influence of the spike error signal can be effectively reduced by placing a low-pass filter at a stage following the Hall electromotive force signal detection circuit in FIG. 18. Though the number of Hall elements connected in parallel with each other is two in FIG. 18, increasing the number of Hall elements connected in parallel with each other can decrease the output impedance of the Hall elements connected in parallel, so it is possible to reduce the influence of the spike error signal.

This feature of the Hall electromotive force signal detection circuit exemplified in FIG. 18 is therefore favorable in a current sensor for inverter current detection, which is required to have a broadband property and a fast response property.

As described above, the Hall electromotive force signal detection circuit according to the present invention can significantly reduce the occurrence of the spike error signal which hinders accuracy enhancement of Hall electromotive force signal detection. The Hall electromotive force signal detection circuit according to the present invention can be suitably applied to a continuous-time signal processing circuit. The Hall electromotive force signal detection circuit according to the present invention may be used as a current sensor.

REFERENCE SIGNS LIST 1, 11 chopper clock generation circuit
2, 12 drive current generation circuit
3, 13, 13a, 13b first Hall element
4, 14 first switching circuit
5 second Hall element
6 second switching circuit
7, 17 Hall electromotive force signal addition circuit
15, 15a, 15b third Hall element
16 third switching circuit
70, 80 signal amplification circuit
71, 81 first transistor differential pair (Gm,1,1)
72 second transistor differential pair (Gm,1,2)
73, 83 fourth switching circuit
74, 84 fourth transistor differential pair (Gm,2)
75, 85 fifth switching circuit
76, 86 Hall electromotive force signal addition circuit output stage
82 third transistor differential pair (Gm,1,3)

The invention claimed is:

1. A Hall electromotive force signal detection circuit configured to select a terminal position for applying a drive current to a Hall element including a plurality of terminals and detect a Hall electromotive force signal voltage, the Hall electromotive force signal detection circuit comprising:

one Hall element including one set of first to fourth terminals, for generating a Hall electromotive force signal voltage;
wherein the first terminal is disposed in a position having 0 degree angle with respect to a preset direction, the second terminal is disposed in a position having 90 degree with respect to the preset direction, the third terminal is disposed in a position having 180 degree with respect to the preset direction, and the fourth terminal is disposed in a position having 270 degree with respect to the preset direction;

another Hall element including another set of first to fourth terminals, for generating another Hall electromotive force signal voltage;
wherein the first terminal is disposed in a position having 0 degree angle with respect to the preset direction, the second terminal is disposed in a position having 90 degree with respect to the preset direction, the third terminal is disposed in a position having 180 degree with respect to the preset direction, and the fourth terminal is disposed in a position having 270 degree with respect to the preset direction;

a first switching circuit for selecting a terminal position for applying a drive current from the first to fourth terminals of the one Hall element;

a second switching circuit for selecting a terminal position for applying a drive current from the first to fourth terminals of the another Hall element, the terminal position selected by the second switching circuit being different from the terminal position selected by the first switching circuit;

a chopper clock generation circuit for supplying a chopper clock signal to the first switching circuit and the second switching circuit; and a Hall electromotive force signal addition circuit for simultaneously adding the Hall electromotive force signal voltage and the another Hall electromotive force signal voltage, wherein a layout of the Hall electromotive force signal detection circuit is that the one Hall element and the another Hall element are arranged in parallel and adjacent to each other, wherein the first switching circuit switches the terminal position for applying the drive current in the one Hall element between the first terminal and the second terminal of the one Hall element based on the chopper clock signal generated by the chopper clock generation circuit, wherein the second switching circuit switches the terminal position for applying the drive current in the another Hall element between the fourth terminal and the third terminal of the another Hall element based on the chopper clock signal generated by the chopper clock generation circuit, wherein the chopper clock generation circuit is a circuit for supplying the chopper clock signal having two different phases, to the first switching circuit and the second switching circuit, wherein, in the first switching circuit, the drive current is applied from the first terminal by electrifying the first terminal and the third terminal when the chopper clock signal is in one of the two phases, and the drive current is applied from the second terminal by electrifying the second terminal and the fourth terminal when the chopper clock signal is in another one of the two phases, wherein, in the second switching circuit, the drive current is applied from the fourth terminal by electrifying the second terminal and the fourth terminal when the chopper clock signal is in the one of the two phases and the drive current is applied from the third terminal by electrifying the third terminal and the first terminal when the chopper clock signal is in the another one of the two phases, wherein the first switching circuit measures electric potential of the second terminal with respect to the fourth terminal of the one Hall element and the second switching circuit measures electric potential of the first terminal with respect to the third terminal of the another Hall element in the one of the two phases, and wherein the first switching circuit measures electric potential of the first terminal with respect to the third terminal of the one Hall element and the second switching circuit measures electric potential of the second terminal with respect to the fourth terminal of the another Hall element in the another one of the two phases.

2. The Hall electromotive force signal detection circuit according to claim 1, wherein the one Hall element and the another Hall element are each a Hall element composed of a plurality of Hall elements connected in parallel.

3. The Hall electromotive force signal detection circuit according to claim 2, wherein the number of Hall elements connected in parallel is two.

4. The Hall electromotive force signal detection circuit according to claim 1, wherein a layout of the Hall electromotive force signal detection circuit is that four Hall elements different in a direction of the drive current are arranged in parallel and adjacent to each other.

5. The Hall electromotive force signal detection circuit according to claim 1, wherein the Hall electromotive force signal detection circuit is used in a current sensor.

6. A Hall electromotive force signal detection circuit configured to select a terminal position for applying a drive current to a Hall element including a plurality of terminals and detect a Hall electromotive force signal voltage, the Hall electromotive force signal detection circuit comprising:

one Hall element group composed of a plurality of Hall elements connected in parallel, each including a set of first to fourth terminals, for generating a Hall electromotive force signal voltage;

wherein the first terminal is disposed in a position having 0 degree angle with respect to a preset direction, the second terminal is disposed in a position having 90 degree with respect to the preset direction, the third terminal is disposed in a position having 180 degree with respect to the first preset direction, and the fourth terminal is disposed in a position having 270 degree with respect to the preset direction;

another Hall element group composed of a plurality of Hall elements connected in parallel, each including another set of first to fourth terminals, for generating another Hall electromotive force signal voltage;

wherein the first terminal is disposed in a position having 0 degree angle with respect to the preset direction, the second terminal is disposed in a position having 90 degree with respect to the preset direction, the third terminal is disposed in a position having 180 degree with respect to the second preset direction, and the fourth terminal is disposed in a position having 270 degree with respect to the preset direction;

a first switching circuit for selecting a terminal position for applying a drive current from the terminals of the one Hall element group;

a second switching circuit for selecting a terminal position for applying a drive current from the terminals of the another Hall element group;

a chopper clock generation circuit for supplying a chopper clock signal to the first switching circuit and the second switching circuit; and a Hall electromotive force signal addition circuit for simultaneously adding the Hall electromotive force signal voltage and the another Hall electromotive force signal voltage, wherein a layout of the Hall electromotive force signal detection circuit is that the one Hall element group and the another Hall element group are arranged in parallel and adjacent to each other, wherein the first switching circuit switches the terminal position for applying the drive current in the one Hall element group between the first terminal and the second terminal of the one Hall element group based on the chopper clock signal generated by the chopper clock generation circuit, and the second switching circuit switches the terminal position for applying the drive current in the another Hall element group between the fourth terminal and the third terminal of the another Hall element group based on the chopper clock signal generated by the chopper clock generation circuit, wherein the chopper clock generation circuit is a circuit for supplying the chopper clock signal having two different phases, to the first switching circuit and the second switching circuit, wherein, in the first switching circuit, the drive current is applied from the first terminal by electrifying the first terminal and the third terminal when the chopper clock signal is in one of the two phases, and the drive current is applied from the second terminal by electrifying the second terminal and the fourth terminal when the chopper clock signal is in another one of the two phases, and in the second switching circuit, the drive current is applied from the fourth terminal by electrifying the second terminal and the fourth terminal when the chopper clock signal is in the one of the two phases and the drive current is applied from the third terminal by electrifying the third terminal and the first terminal when the chopper clock signal is in the another one of the two phases, wherein the first switching circuit measures electric potential of the second terminal with respect to the fourth terminal of the one Hall element group and the second switching circuit measures electric potential of the first terminal with respect to the third terminal of the another Hall element group in the one of the two phases, and wherein the first switching circuit measures electric potential of the first terminal with respect to the third terminal of the one Hall element group and the second switching circuit measures electric potential of the second terminal with respect to the fourth terminal of the another Hall element group in the another one of the two phases.

7. The Hall electromotive force signal detection circuit according to claim 6, wherein the number of the Hall elements in either of the groups connected in parallel is two.

* * * * *